United States Patent
Eida et al.

[11] Patent Number: 6,137,459
[45] Date of Patent: Oct. 24, 2000

[54] IMAGE DISPLAY DEVICE HAVING A PLANARIZED ARRAY OF REDUCED SURFACE ROUGHNESS

[75] Inventors: Mitsuru Eida; Masahide Matsuura, both of Sodegaura; Takeki Kofuji, Tokyo, all of Japan

[73] Assignee: Idemitsu Kosan Co., Ltd., Tokyo, Japan

[21] Appl. No.: 09/021,817

[22] Filed: Feb. 11, 1998

[30] Foreign Application Priority Data

Feb. 21, 1997 [JP] Japan ................................ 9-054149

[51] Int. Cl.⁷ ...................... G09G 3/30; G09G 3/12; H01J 63/04
[52] U.S. Cl. .................... 345/76; 345/45; 345/81; 313/501; 313/506; 313/507
[58] Field of Search ................. 313/501, 506, 313/507; 345/45, 81, 76

[56] References Cited

U.S. PATENT DOCUMENTS

| | | | |
|---|---|---|---|
| 5,156,924 | 10/1992 | Taniguchi et al. | 428/690 |
| 5,464,714 | 11/1995 | Watanabe et al. | 451/533 |
| 5,573,444 | 11/1996 | Ryoke et al. | 430/27 |
| 5,932,327 | 8/1999 | Inoguchi et al. | 428/212 |
| 5,958,610 | 9/1999 | Watanabe et al. | 428/690 |

FOREIGN PATENT DOCUMENTS 0 550 063  7/1993  European Pat. Off. .
0 735 401  10/1996  European Pat. Off. .

OTHER PUBLICATIONS

Abstract of International Application, WO97/34447, Sep. 18, 1997.

Abstract of International Application, WO97/46054, Dec. 4, 1997.

*Primary Examiner*—Mark R. Powell
*Assistant Examiner*—Ryan Yang
*Attorney, Agent, or Firm*—Oblon, Spivak, McClelland, Maier & Neustadt, P.C.

[57] ABSTRACT

Disclosed is a practicable, image display device comprising a color-changing array 2 of a plurality of light-shielding layers 21 and a plurality of color-changing layers 22, of which at least one is a fluorescent layer, as disposed in series on a light-transmissive substrate 1 with being laterally spaced, and an array of a plurality of light-emitting layers 3 as laterally spaced to be in the position corresponding to each color-changing layer 22 in such a manner that the color-changing layers 22 receive emitted light from the light-emitting layers 3 to change it into different colors. The device is characterized in that the surface of the color-changing array 2 that faces the array of light-emitting layers 3 is planarized to thereby reduce its surface roughness to 2.0 μm or lower. The images formed by the device have high visibility with little color mixing and color spread. The producibility of the device is high.

56 Claims, 8 Drawing Sheets

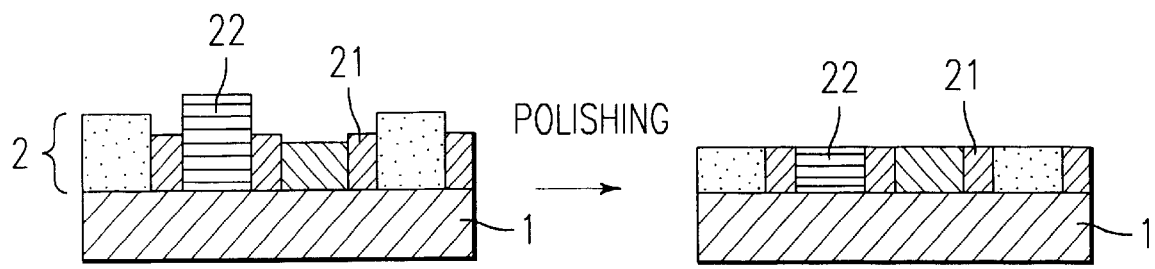
*FIG. 7A*  *FIG. 7B*
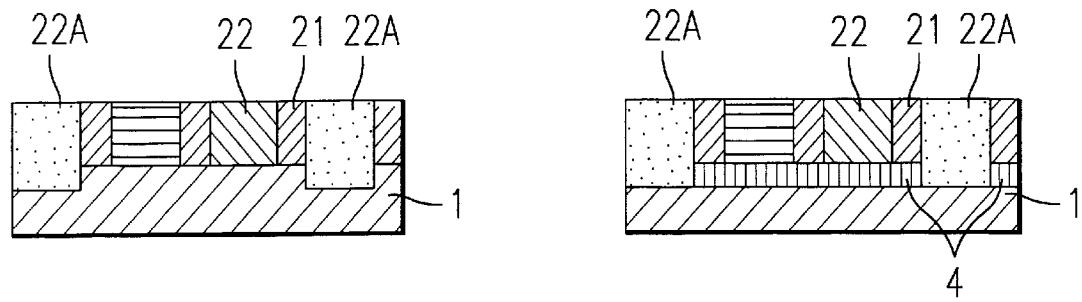
*FIG. 8A*  *FIG. 8B*
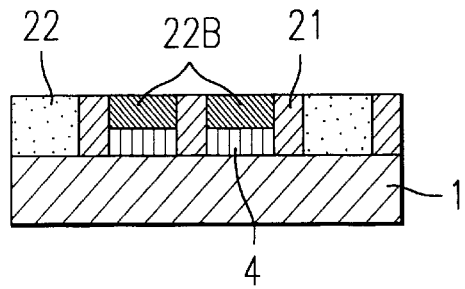
*FIG. 9*
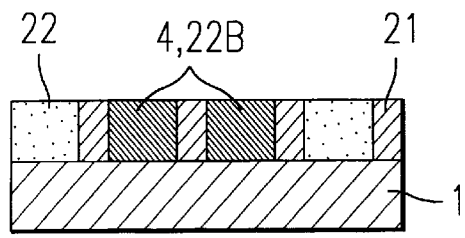
*FIG. 10*

IMAGE DISPLAY DEVICE HAVING A PLANARIZED ARRAY OF REDUCED SURFACE ROUGHNESS

FIELD OF THE INVENTION

The present invention relates to an image display device. More precisely, it relates to an image display device favorably used in image display appliances and color displays for civil and industrial use.

BACKGROUND OF THE INVENTION

Electronic display devices have another name of "man-machine interface", which have an important role of "interface" to transmit various visual information to "man" from "machine" while connecting "man" and "machine" via "interface".

Known are two types of such electronic display devices, emissive one and non-emissive one. Emissive display devices include, for example, CRT (cathode ray tube), PDP (plasma display panel), ELD (electroluminescent display), VFD (vacuum fluorescent display), and LED (light emitting diode). None-emissive display devices include, for example, LCD (liquid crystal display), ECD (electrochemical display), EPID (electrophoretic image display), SPD (suspended particle display), TBD (twisting ball display), and PLZT (transparent ferroelectric PLZT [(Pb,La)(Zr,Ti)$O_3$] ceramics display).

For multicolor imaging in electronic display devices, for example, known are a method of disposing multicolor emitting zones (for example, for three primary colors of red, blue and green) with being laterally spaced to separately emit the intended color, and a method of disposing a plurality of different color-changing layers (for example, color filters or phosphors) in which those color-changing layers receive monochromatic light and separate or change its color to emit different colors.

ELD is characterized by its high visibility as being self-luminescent, and by its high impact resistance as being completely solid. At present, various types of ELD are being developed, comprising inorganic or organic compounds in their light-emitting layers. Of those, organic EL devices (organic ELD) comprising organic compounds as sandwiched between two electrodes are greatly expected to be in displays capable of efficiently emitting high-luminance light in various color regions, since plenty of different organic compounds are employable therein.

Turning to the current multicolor imaging methods using those organic EL devices, the method using ELD that comprises different color emission zones as laterally spaced to produce different colors is problematic in that it requires different light-emitting materials for different colors and that the materials, as being organic compounds, are poorly resistant to the working (e.g., photolithography) of laterally spacing them on substrates. Therefore, the method using ELD that comprises a plurality of different color-changing layers capable of separating or changing the color of monochromatic light into different colors is preferred, as being simple, since light-emitting layers for monochromatic light only may be provided in ELD.

In ELD having color filters as the color-changing layers, light loss is great because of the function of the color filters through which the color of light is separated or cut. For example, where the color of white light emitted is separated into three primary colors (red, green, blue) through color filters, the white luminance is reduced to at most ⅓.

On the other hand, in ELD having color-changing layers of phosphors, the layers have the function of absorbing light to change it into longer wavelength fluorescence with smaller energy. For example, if phosphors having a degree of light absorption of 80% emit fluorescence at an yield of 80%, they can change light into longer wavelength light at an yield of 64%. In fact, known are phosphors of that type. Accordingly, color-changing layers of phosphors are preferred in ELD, as being able to efficiently utilize light.

Known are some multicolor structures to be in organic EL devices, in which monochromatic light is changed into different colors through a plurality of different color-changing layers of phosphors, for example, as in Japanese Patent Applications (JP-A) Laid-Open Nos. 3-152897 and 5-255860. In JP-A 5-255860, disclosed is an image display device as in FIG. 11, in which fluorescent media are so disposed that they can receive emitted light from the organic EL medium.

However, as having no light-shielding layers, the disclosed image display device is defective in that light as isotropically emitted by the organic EL medium passes through the insulative planarizing layer (light-transmissive medium) to penetrate into not only the intended fluorescent medium but also the adjacent fluorescent medium thereby causing color mixing.

The disclosed image display device has a laminate structure comprising an organic EL medium as superposed over fluorescent media, in which the organic EL medium of a thin layer is sandwiched between two electrodes. In this, therefore, the influence of the surface roughness of the underlying fluorescent media on the organic EL medium is great. Specifically, the rough surfaces of the underlying fluorescent media will cause leak between the two electrodes and will even break the connection therebetween, thereby having some negative influences on the driving capability of the device and, after all, lowering the production yield of the device.

In JP-A 5-258860, disposed is an insulative planarizing layer between the fluorescent media and the organic EL medium, thereby compensating the surface roughness of the fluorescent media. In this, however, disclosed is no technique of unifying the different fluorescent media to thereby planarize those media all at a time. In JP-A 5-258860, the thickness of the fluorescent medium is defined to be smaller than 10 μm. However, the fluorescent medium having a thickness of smaller than 10 μm is unsatisfactory for emitting fluorescence.

SUMMARY OF THE INVENTION

The present invention has been made in consideration of the problems noted above, and its object is to provide an image display device for practical use, which is advantageous in that the images formed have good visibility with no color mixing and that its producibility is high.

Specifically, in order to attain the object, the invention provides an image display device comprising a color-changing array of a plurality of light-shielding layers and a plurality of color-changing layers, of which at least one is a fluorescent layer, as disposed in series on a light-transmissive substrate with being laterally spaced, and an array of a plurality of light-emitting layers as laterally spaced to be in the position corresponding to each color-changing layer in such a manner that the color-changing layers receive emitted light from the light-emitting layers to change it into different colors, the device being characterized in that the surface of the color-changing array that faces the array of light-emitting layers is planarized to thereby reduce its surface roughness to 2.0 µm or lower.

In one preferred embodiment of the device of the invention, the color-changing array and the light-emitting array are disposed via a light-transmissive medium therebetween.

In another preferred embodiment, the light-emitting array is of an organic electroluminescent (EL) element.

In still another preferred embodiment, the thickness of each color-changing layer is 10 µm or more.

In still another preferred embodiment, the surface of the color-changing array that faces the light-emitting array is polished.

In still another preferred embodiment, at least one of the color-changing layers is partly embedded in the light-transmissive substrate or in the light-transmissive medium at its bottom.

In still another preferred embodiment, at least one of the color-changing layers is separated from the light-transmissive substrate at its bottom via a light-transmissive medium therebetween.

In still another preferred embodiment, at least one of the light-changing layers contains a light-transmissive medium.

In still another preferred embodiment, at least one of the light-changing layers is a red-emitting fluorescent layer.

BRIEF DESCRIPTION OF THE DRAWINGS

1. Light-transmissive Substrate
2. Color-changing Array
3. Light-emitting Array
21. Light-shielding Layer
22. Color-changing Layer

FIG. 5(a) is a cross-sectional view of a reference device, while

(1) Strain
(2) Light-emitting Area
31. Organic EL Element
32. Electrode
34. Organic Layer
33. (Transparent) Electrode These FIG. 5(a) and FIG. 5(b) graphically indicate the location of the color-changing array and the light-emitting array, in which each color-changing layer is in direct contact with each light-emitting layer to thereby make the light-emitting array follow the surface roughness of the color-changing array.

Figure 6:
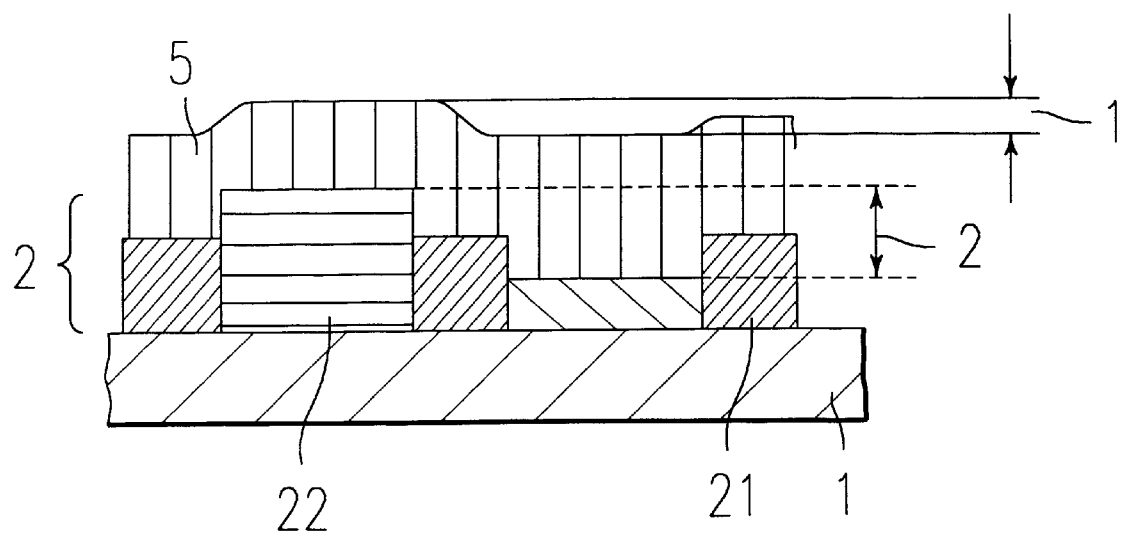

FIG. 6 is a cross-sectional view of a reference device having a planarizing layer as formed over the color-changing array, which graphically indicates the influence of the planarizing layer on the surface roughness of the color-changing array, wherein each number represents as the following:

(1) Surface roughness of color-changing array coated with planarizing layer
(2) Surface roughness of non-coated color-changing array
5. Planarizing Layer (light-transmissive medium)

FIG. 7(a) and FIG. 7(b) are cross-sectional views, which graphically show the polishing of the color-changing array for the device of the invention.

FIG. 8(a) and FIG. 8(b) are cross-sectional views of different embodiments of the device of the invention. In the former, the thick color-changing layers are partly embedded in the light-transmissive substrate at their bottom; while in the latter, the thick color-changing layers are partly embedded in the light-transmissive medium at their bottom.

FIG. 9 is a cross-sectional view of a different embodiment of the device of the invention, in which the thin color-changing layers are separated from the light-transmissive substrate at their bottom via a light-transmissive medium disposed therebetween.

FIG. 10 is a cross-sectional view of a different embodiment of the device of the invention, in which some color-changing layers contain a light-transmissive medium.

Figure 11A:
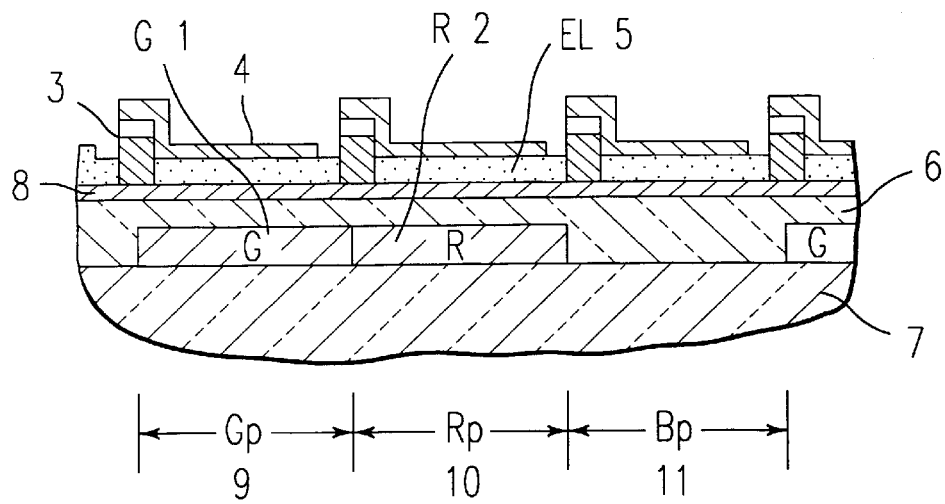
Figure 11B:
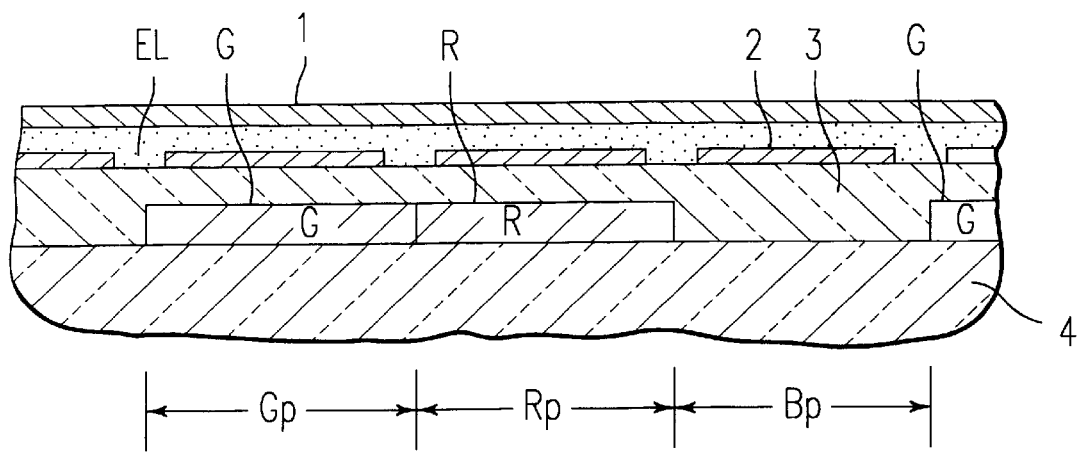
Figure 12:
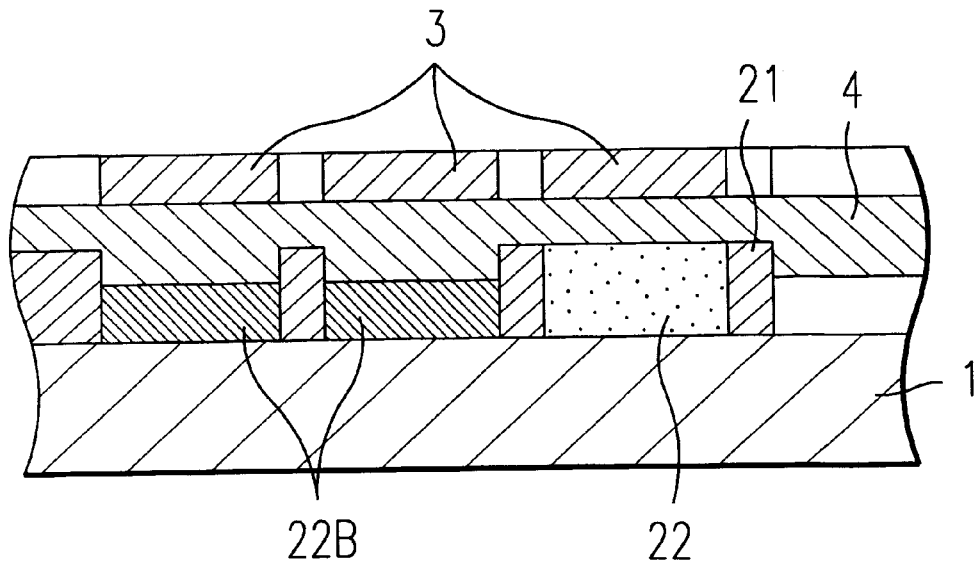

FIG. 11(a) wherein each number represents as the following:

(1) G: Green-emitting Fluorescent Medium
(2) R: Red-emitting Fluorescent Medium
(3) Wall
(4) Second Electrode (cathode)
(5) EL: Organic Electroluminescent Medium
(6) Insulative Planarizing Layer
(7) Substrate
(8) First Electrode (anode)
(9) Green-emitting Sub-pixel
(10) Red-emitting Sub-pixel
(11) Blue-emitting Sub-pixel and FIG. 11(b) wherein each number represents as the following:

(1) Second Electrode (cathode)
(2) First Electrode (anode)
(3) Insulative Planarizing Layer
(4) Substrate are cross-sectional views of conventional image display devices, which comprise fluorescent media capable of receiving emitted light from the organic EL medium as disposed over the fluorescent media FIG. 12 is a cross-sectional view graphically showing the basic constitution of the device formed in Comparative Example 1.

Figure 13:
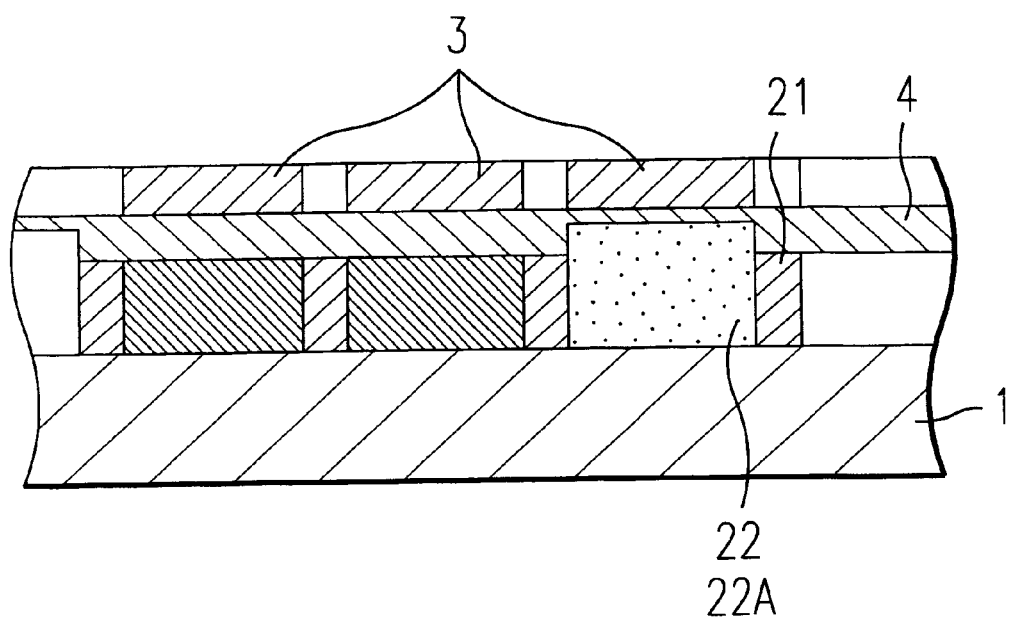

FIG. 13 is a cross-sectional view graphically showing the basic constitution of the device formed in Comparative Example 2.

In these drawings, 1 is a light-transmissive substrate, 2 is a color-changing array, 21 is a light-shielding layer, 22 is a color-changing layer, 22a is a thick color-changing layer, 22b is a thin color-changing layer, 3 is a light-emitting layer, 31 is an organic EL element, 32 is an electrode, 33 is a (transparent) electrode, 34 is an organic layer, 4 is a light-transmissive medium, and 5 is a planarizing layer (light-transmissive medium).

DESCRIPTION OF PREFERRED EMBODIMENTS OF THE INVENTION

Now, preferred embodiments of the image display device of the invention are described herein under with reference to the accompanying drawings.

Figure 2:
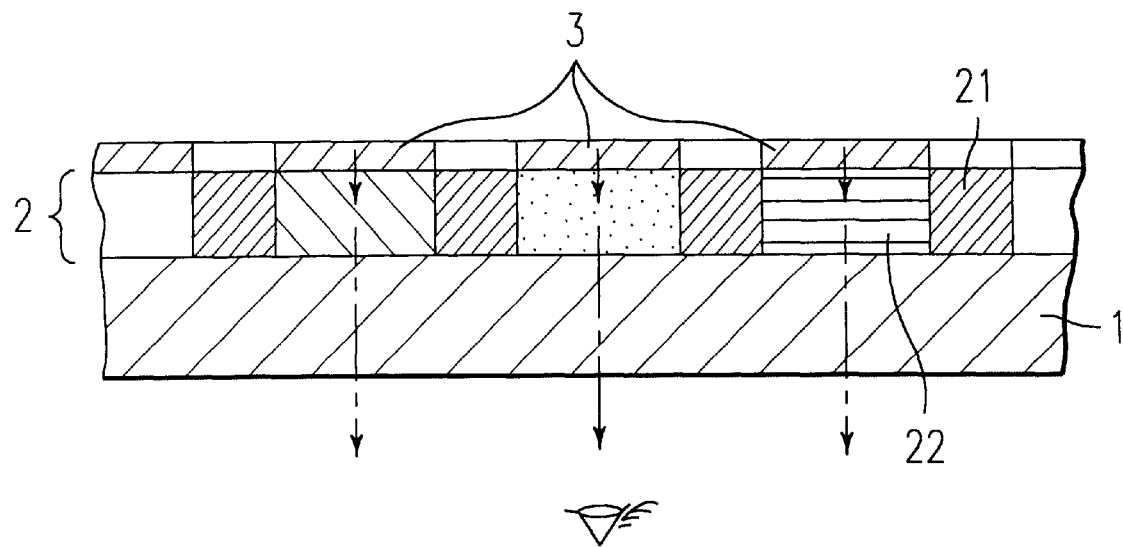
FIG. 2 is a cross-sectional view graphically showing one basic constitution of the device of the invention.

1. Constitution of Image Display Device:

One basic constitution of the image display device of the invention is shown in FIG. 2, which comprises a color-changing array 22 of a plurality of light-shielding layers 21 and a plurality of different color-changing layers 22, of which at least one is a fluorescent layer, as disposed in series on a light-transmissive substrate 1 with being laterally spaced, and an array of a plurality of light-emitting layers 3 as laterally spaced to be in the position corresponding to each color-changing layer 22 in such a manner that the color-changing layers receive emitted light from the light-emitting layers to change it into different colors.

The light emitted by each light-emitting layer 3 passes through the corresponding color-changing layer 22, through which its color is changed into a different one, and the viewer receives the thus-changed color. Arranging those different color-changing layers 22 as laterally spaced realizes multicolor emission.

On the other hand, arranging the same color-changing layers 22 gives monochromatic emission. Therefore the invention is not defined by multicolor.

For the multicolor emission, some of those different color-changing layers 22 may be transparent ones with no dye, through which emitted light from the EL element may directly pass.

Figure 3:
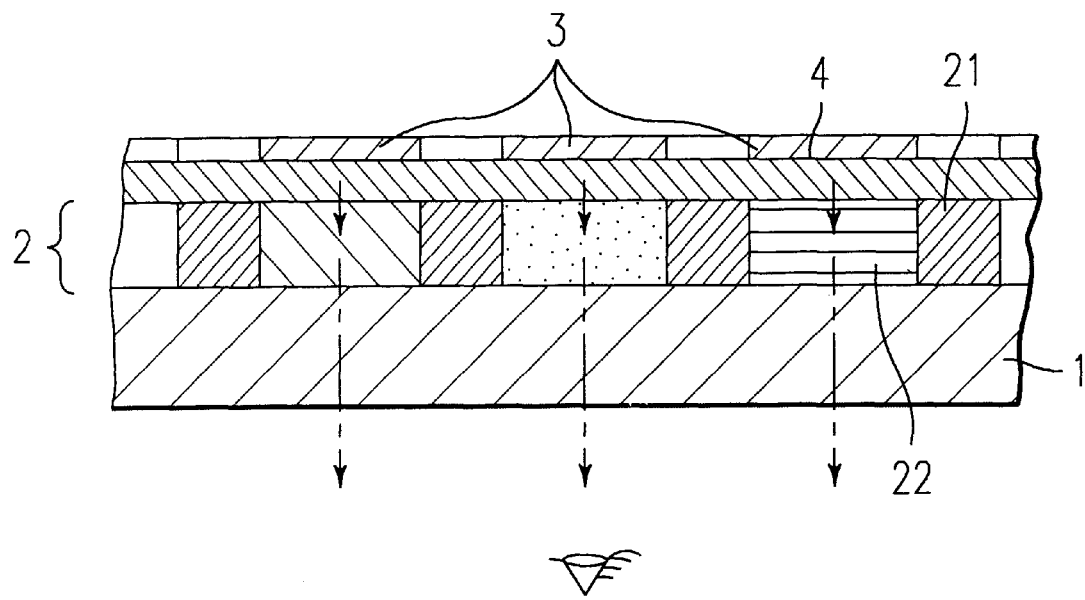
FIG. 3 is a cross-sectional view graphically showing another basic constitution the device of the invention, in which is provided a light-transmissive medium between the color-changing array and the light-emitting array.

As in FIG. 3, a light-transmissive medium 4 may be provided between the color-changing array 2 and the light-emitting array 3.

Figure 1:
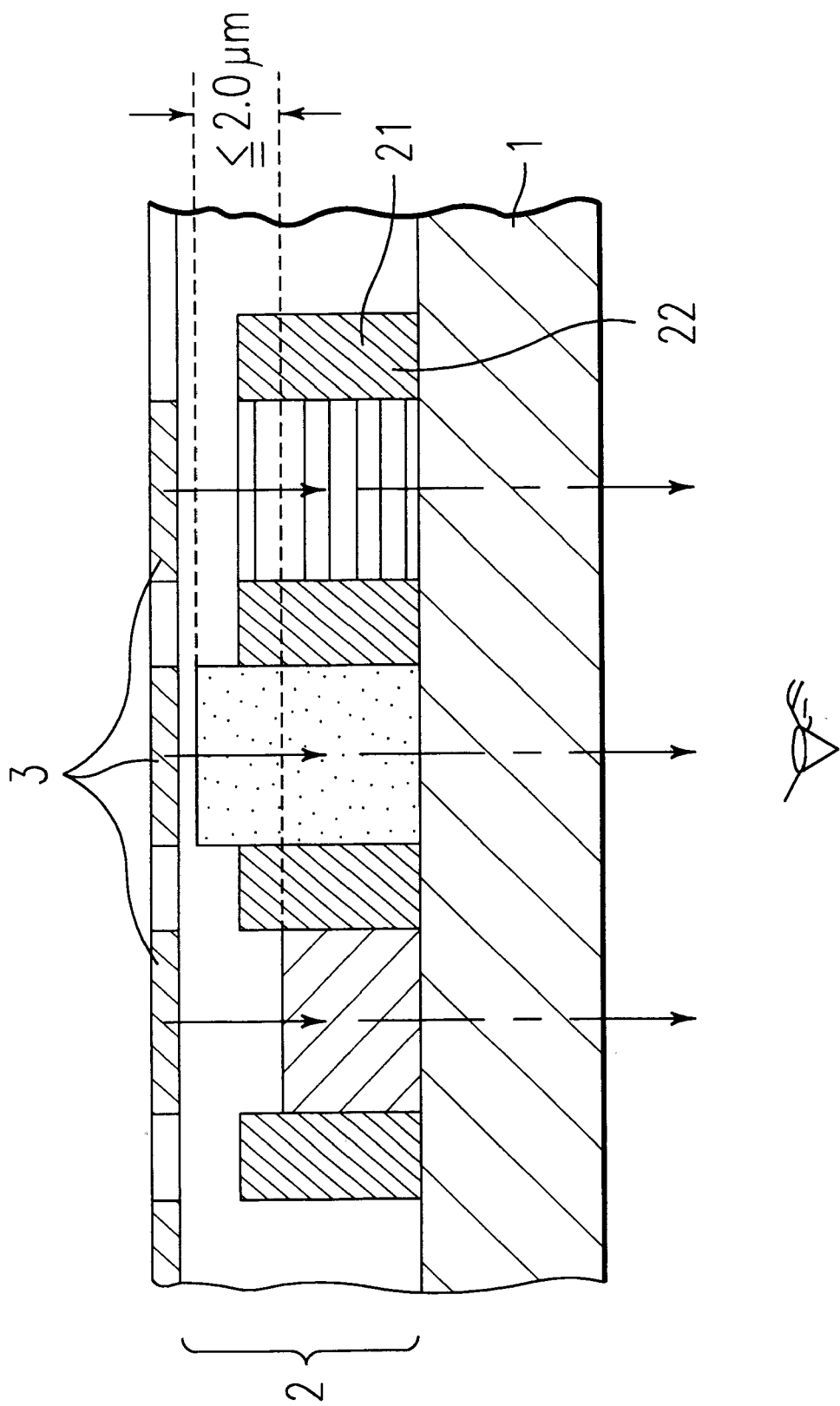
FIG. 1 is a cross-sectional view graphically showing one embodiment of the image display device of the invention wherein each number represents as the following.

The invention has proposed an image display device as illustrated in FIG. 1, in which the surface of the color-changing array 2 that faces the light-emitting array 3 is planarized to thereby reduce its surface roughness to 2.0 μm or lower.

Reference devices are referred to herein under, which are different from the device of the invention in that, in the reference devices, the surface roughness of the color-changing array that faces the light-emitting array is not reduced.

Figure 4A:
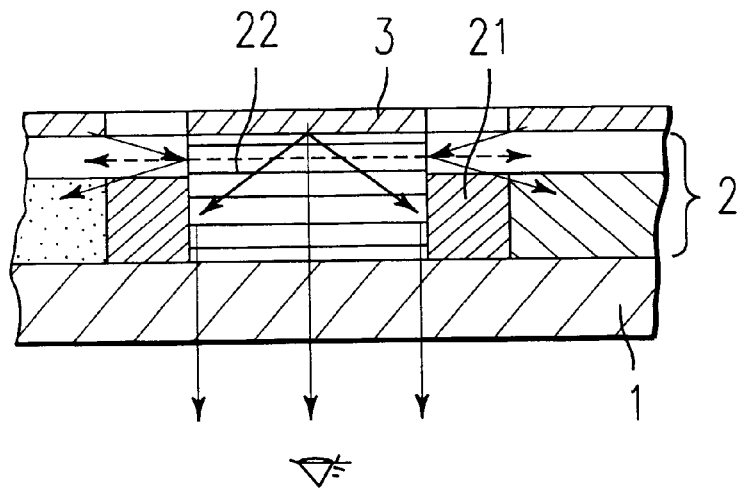
FIG. 4(a) and FIG. 4(b) are cross-sectional views of reference devices, each graphically indicating the influence of the thickness of the color-changing layer, relative to the standardized thickness of the adjacent light-shielding layers, on the properties of the devices.

In the reference device illustrated in FIG. 4(a), the color-changing layer 22 is made thicker relative to the standardized thickness of the adjacent light-shielding layers 21. In the reference device illustrated in FIG. 4(b), the color-changing layer 22 is made thinner relative to the standardized thickness of the adjacent light-shielding layers 21.

In the reference device of FIG. 4(a), light as isotropically emitted by a specific light-emitting layer 3(in front or slanting front of the color-changing layer) is introduced into the color-changing layer (fluorescent layer) 22, which changes the color of the thus-introduced light into a different one and isotropically emits the thus-changed light (fluorescent light). In this, since the light-changing layer 22 is thicker than the adjacent light-shielding layers 21, the emitted light from that thick light-changing layer 22 partly leaks out over the adjacent light-shielding layers 21 to the other color-changing layers, thereby causing color mixing or color spread.

Figure 4B:
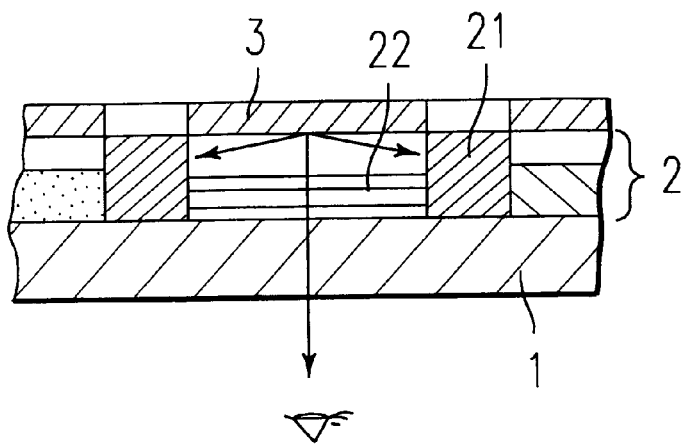

On the other hand, in the reference device of FIG. 4(b), the color-changing layer 22 is thinner than the adjacent light-shielding layers 21. In this, therefore, the light-shielding layers 21 prevent the light emitted by the color-changing layer 22 from leaking out to the other color-changing layers. In this, however, those thick light-shielding layers 21 absorb and even scatter the light that has been emitted by the light-emitting layer 3, resulting in that the thin color-changing layer 22 could not satisfactorily receive the light emitted by the light-emitting layer 3, or, in other words, the light absorption efficiency of the layer 22 is poor.

As a result, the luminance of the light that has been emitted by the color-changing layer 22 is lowered, and the visibility of the device is lowered. Other reference devices where light-shielding layers are too thick or too thin also have the same problems as those with the devices of FIG. 4(a) and FIG. 4(b). For these reasons, therefore, it is advantageous to unify as much as possible the thickness of the light-shielding layers 21 and that of the color-changing layers 22, or, that is, to reduce as much as possible the surface roughness of the color-changing array 2 that faces the light-emitting array 3, in order to improve the visibility of the image display device of this class and, more precisely, to prevent color mixing in the device and to increase the luminance of the device. The same shall apply also to the embodiment of FIG. 3 which has the light-transmissive medium as disposed between the color-changing array 2 and the light-emitting array 3.

Figure 5A:
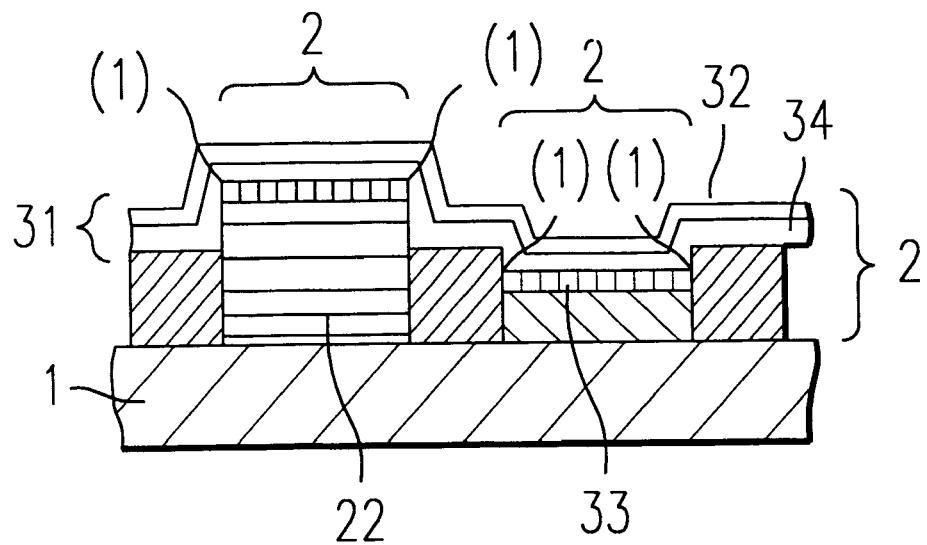
Figure 5B:
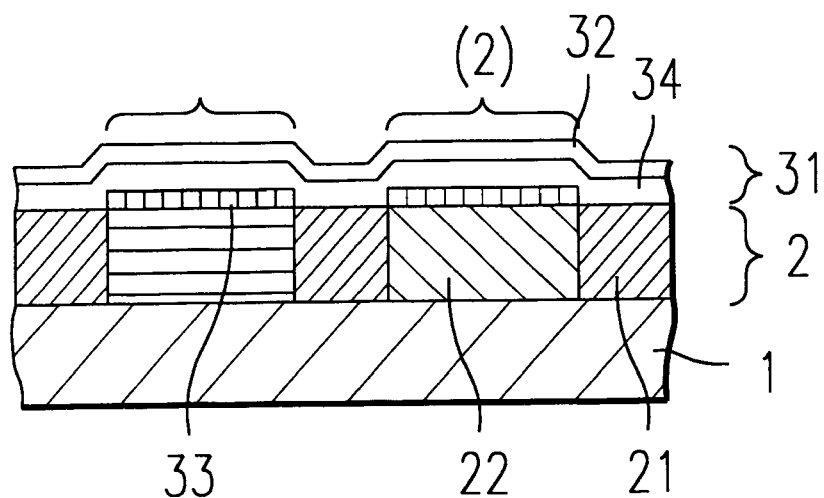
FIG. 5(b) is a cross-sectional view of the device of the invention wherein each number represents as the following.

FIG. 5(a) and FIG. 5(b) graphically indicate the location of the color-changing array 2 and the light-emitting array (for example, organic EL element 31), in which each color-changing layer 22 is in direct contact with each light-emitting layer to thereby make the light-emitting array follow the surface roughness of the color-changing array 2. In these, the organic EL element 31 comprises an organic layer 34 (essentially, a light-emitting layer) as sandwiched between two electrodes 32 and 33 which are in stripes and intersect with each other.

In the reference device of FIG. 5(a), the surface roughness of the color-changing array 2 is great. Therefore, in this, the thin film of the organic EL element 31 is strained, thereby causing leak between the two electrodes 32 and 33 constituting the organic EL element 31 and causing breakage of the electrode 32 with the result that the production yield of the image display device is lowered.

In the device of FIG. 5(b) of the invention, the surface roughness of the color-changing array 2 is small. In this, therefore, the organic EL element 31 is not strained. Accordingly, the production yield of the image display device is improved.

As in FIG. 6, a transparent planarizing layer 5, or that is, a light-transmissive medium may be laminated over the color-changing array 2 of the reference device of FIG. 5(a) to thereby reduce the surface roughness of the color-changing array 2. In this, however, if the planarizing layer 5 is too thick, light emitted by the light-emitting array (not shown) leaks out to cause color mixing and even to narrow the angle of view. The thickness of the planarizing layer 5 depends on the degree of fineness of the color-changing array 2 and also on that of the light-emitting array, and the planarizing layer 5 is preferably thinner as being free from the problems mentioned above. The smaller surface roughness of the color-changing array 2 facilitates the planarization of the array 2 itself, and the thickness of the planarizing layer 5 to be on the array 2 with such smaller surface roughness may be reduced.

The relationship between the degree of surface roughness of the color-changing array 2 and the production yield of the image display device having an organic EL element as the light-emitting array laminated over the color-changing array 2 could be presumed from the data (in Table 1 below) of different organic EL elements as formed on various substrates having different surface roughness. As in Table 1, it is known that the organic EL elements as formed on substrates having a degree of surface roughness of not larger than 2.0 μm are neither broken nor short-circuited to lower the luminance or to cause cross-talk (emission in undesired regions). From those data, therefore, it is believed that the surface roughness of the color-changing array in image display devices has some influences on the production yield of the devices.

TABLE 1

| Surface Roughness of Substrate (μm) | Luminance Decrease[1] | Cross-talk[1] |
| --- | --- | --- |
| 0.2 | Undetectable | Undetectable |
| 0.5 | Undetectable | Undetectable |
| 1.0 | Undetectable | detectable, a little |
| 2.0 | detectable, a little | detectable, a little |
| 3.0 | detectable | detectable |
| 4.0 | detectable | detectable |
| 5.0 | detectable | detectable |

[1] Based on the organic EL element formed on a smooth, light-transmissive substrate (having a degree of surface roughness of smaller than 0.1 μm).

FIG. 7 shows one embodiment of the color-changing array 2 with reduced surface roughness, of which the entire surface that shall face a light-emitting array (not shown) is polished.

The polishing may be effected after the formation of the light-shielding layers 21 and the color-changing layers 22, or that is, after the formation of the color-changing array 2. For this, for example, the surface of the color-changing array 2 may be lapped with commercially-available sandpaper or lapping film of alumina, silicon carbide or the like, or may be polished with a rotary grinder, using fine ceramic grains of alumina or the like as the abrasive, while being washed with water. The thus-polished surface may be further processed to be a mirror-finished surface.

FIG. 8(a) shows another embodiment of the color-changing array with reduced surface roughness, in which the thick ones 22a of the color-changing layers 22 are partly embedded in the light-transmissive substrate 1 at their bottom to control their thickness.

FIG. 8(b) shows still another embodiment of the color-changing array with reduced surface roughness, in which the thick ones 22a of the color-changing layers 22 are partly embedded in the light-transmissive medium 4 at their bottom to control their thickness.

FIG. 9 shows still another embodiment of the color-changing array with reduced surface roughness, in which the thin ones 22b of the color-changing layers 22 are separated from the light-transmissive substrate 1 at its bottom via a light-transmissive medium 4 disposed therebetween, thereby controlling their thickness.

FIG. 10 shows still another embodiment of the color-changing array with reduced surface roughness, in which the thin ones 22b of the color-changing layers 22 are made to contain a light-transmissive medium 4, thereby controlling their thickness.

In the device of the invention, the color-changing array may comprise a combination of those different embodiments.

2. Constituent Elements of Image Display Device:

(1) Light-transmissive substrate:

The light-transmissive substrate to be in the image display device of the invention is to support the device, which is preferably a smooth one having a transmittance of not smaller than 50% in the region between 400 nm and 700 nm in wave length( visible ray). Concretely mentioned are glass sheets, polymer sheets, etc. For the glass sheets, for example, mentioned are soda lime glass, barium-strontium glass, lead glass, aluminosilicate glass, borosilicate glass, barium borosilicate glass, and quartz. For the polymer sheets, for example, mentioned are polycarbonates, acrylic resins, polyethylene terephthalates, polyether sulfides, and polysulfones. For the embodiment where thick color-changing layers are partly embedded in the light-transmissive substrate at their bottom, for example, a desired resist pattern is formed on the substrate by photolithography or printing method, before or after the formation of light-shielding layers thereon, and thereafter suitable grooves corresponding to the color-changing layers to be embedded in the substrate are formed on the substrate, for example, by a physical means of sand-blasting or by a chemical means of etching with hydrofluoric acid.

(2) Color-changing layer:

Of the color-changing layers constituting the device of the invention, one or more are fluorescent layers. The color-changing layers may include color filters for color control capable of separating or cutting the color of light that has been emitted by each light-emitting layer and has passed through them.

The fluorescent layers may comprise fluorescent dye and resin, or may be of fluorescent dye only. The layers comprising fluorescent dye and resin may be prepared by dissolving or dispersing fluorescent dye in pigment resin and/or binder resin, and these are in solid.

Herein under mentioned are specific examples of fluorescent dye for use in the invention. Examples of fluorescent dye capable of changing light emitted by organic EL elements in a near-ultraviolet to violet region into blue emission are stilbene pigments such as 1,4-bis(2-methylstyryl) benzene (hereinafter referred to as Bis-MSB) and trans-4,4'-diphenylstilbene (hereinafter referred to as DPS); and coumarin dyes such as 7-hydroxy-4-methylcoumarin (hereinafter referred to as Coumarin 4).

Examples of fluorescent dye capable of changing light emitted by blue, blue-green or white emitting layers into green emission are coumarin dyes such as 2,3,5,6-1H,4H-tetrahydro-8-trifluoromethylquinolidino(9,9a,1-gh) coumarin (hereinafter referred to as Coumarin 153), 3-(2'-benzothiazolyl)-7-diethylaminocoumarin (hereinafter referred to as Coumarin 6), and 3-(2'-benzimidazolyl)-7-N, N-diethylaminocoumarin (hereinafter referred to as Coumarin 7); other coumarin dyes such as Basic Yellow 51; and naphthalimide dyes such as Solvent Yellow 11, and Solvent Yellow 116.

Examples of fluorescent dye capable of changing light emitted by blue to green or white emitting layers into orange to red emission are cyanine dyes such as 4-dicyanomethylene-2-methyl-6-(p-dimethylaminostyryl)-4H-pyran (hereinafter referred to as DCM); pyridine dyes such as 1-ethyl-2-(4-(p-dimethylaminophenyl)-1,3-butadienyl)-pyridinium perchlorate (hereinafter referred to as Pyridine 1); rhodamine dyes such as Rhodamine B, and Rhodamine 6G; and oxazine dyes.

In addition to the above, also usable herein are various fluorescent dyes (e.g., direct dyes, acidic dyes, basic dyes, disperse dyes).

The fluorescent dye may be kneaded into pigment resin (pigment). The pigment resin includes, for example, polymethacrylates, polyvinyl chlorides, vinyl chloride-vinyl acetate copolymers, alkyd resins, aromatic sulfonamide resins, urea resins, melamine resins and benzoguanamine resins.

These fluorescent dyes and pigments can be used either singly or as combined, if desired.

The binder resin is preferably a transparent one (having a visible ray transmittance of not smaller than 50%). For example, it includes transparent resins (polymers), such as polymethyl methacrylates, polyacrylates, polycarbonates, polyvinyl alcohols, polyvinyl pyrrolidones, hydroxyethyl celluloses and carboxymethyl celluloses.

For lateral spacing of fluorescent layers, usable are photosensitive resins for photolithography. For this, for example, usable are photo-curable resist materials having reactive vinyl groups, such as acrylic acid-type materials, methacrylic acid-type materials, polyvinyl cinnamate-type materials and cyclic rubber materials. For a printing method for lateral spacing of fluorescent layers, used is printing ink (medium) comprising transparent resin. For this, for example, usable are oligomers and polymers of polyvinyl chloride resins, melamine resins, phenolic resins, alkyd resins, epoxy resins, polyurethane resins, polyester resins, maleic acid resins and polyamide resins, and also polymethyl methacrylates, polyacrylates, polycarbonates, polyvinyl alcohols, polyvinyl pyrrolidones, hydroxyethyl celluloses, carboxymethyl celluloses and other transparent resins.

For fluorescent layers consisting essentially of fluorescent dye, in general, a desired fluorescent layer pattern may be formed on a substrate, using a mask, through vacuum vapor deposition or sputtering. For fluorescent layers comprising fluorescent dye and resin, in general, a liquid mixture as prepared by mixing, dispersing or solubilizing fluorescent dye and resin in a suitable solvent may be applied onto a substrate through spin-coating, roll-coating or casting to form a film on the substrate, and thereafter the thus-formed film is patterned through photolithography to form a desired fluorescent layer pattern on the substrate; or alternatively, the liquid mixture may be directly screen-printed on a substrate to form a desired fluorescent layer pattern thereon.

The thickness of the fluorescent layers is not specifically defined, provided that the layers can satisfactorily receive (absorb) light emission from the overlying organic EL element, without interfering with their function of fluorescent emission, but is generally from 10 nm to 1 mm, preferably from 1 $\mu$m to 1 mm, more preferably from 10 $\mu$m to 100 $\mu$m. In general, the fluorescent layers are thicker than color filters. Fluorescent dyes generally depend more on their concentration, as compared with color filter coloring matters, and are therefore desired to be dispersed or solubilized in pigment resin or binder resin at lower concentrations to exhibit higher fluorescent capability. However, since they must satisfactorily absorb light emission from the overlying organic EL element, their absorbance must be comparable to the absorbance of color filters. As a result, therefore, the fluorescent layers are desired to be thick in accordance with the Lambert-Beer's law of the following equation (1) in which the extinction coefficient of the dye is intrinsic to the dye and is constant. The concentration of the fluorescent dye to be in the fluorescent layer that contains pigment resin and/or binder resin varies, depending on the type of the fluorescent dye, but may be from 1 to $10^{-4}$ mol/kg, preferably from 0.1 to $10^{-3}$ mol/kg, more preferably from 0.05 to $10^{-2}$ mol/kg.

Lambert-Beer's Law:

$$A = \epsilon c l \qquad (1)$$

where;
A=absorbance of the layer;
$\epsilon$=extinction coefficient of the pigment (this is intrinsic to the pigment);
c=concentration of the pigment;
l=thickness of the layer.

In order to reduce the surface roughness of the color-changing array that faces the light-emitting array in the device of the invention, it is advantageous to unify as much as possible the thickness of each color-changing layer (fluorescent layer or color filter layer). Therefore, in consideration of the fluorescence-emitting capability of the color-changing layers, the thickness of each color-changing layer is desirably not smaller than 10 $\mu$m.

The red-emitting fluorescent layer emits fluorescence as more greatly shifted to a longer wavelength site from the wavelength light that has been emitted by the overlying light-emitting layer, or that is, it has a larger degree of Stokes' shift. Therefore, the red-emitting fluorescent layer generally contains a plurality of different fluorescent dyes in combination. In other words, since the red-emitting fluorescent layer has a large concentration of mixed fluorescent dyes, its thickness must be large in order that the layer can satisfactorily absorb the light emitted by the overlying light-emitting layer to thereby exhibit high fluorescent emission. For the red-emitting fluorescent layer, therefore, preferred are the embodiments of FIG. 8(a) and FIG. 8(b) in which the color-changing layer 22a of the red-emitting fluorescent layer is partly embedded in the light-transmissive substrate 1 or the light-transmissive medium 4 at its bottom.

For the color filter layers, for example, employable are the following coloring matters either alone or as dissolved or dispersed in binder resin to be in solid.

Red (R) coloring matters:
Perylene pigments, lake pigments, azo pigments, quinacridone pigments, anthraquinone pigments, anthracene pigments, isoindoline pigments, isoindolinone pigments. These can be used either singly or as combined.

Green (green) coloring matters:
Polyhalogen-substituted phthalocyanine pigments, polyhalogen-substituted copper phthalocyanine pigments, triphenylmethane-type basic pigments, isoindoline pigments, isoindolinone pigments. These can be used either singly or as combined.

Blue (B) coloring matters:
Copper phthalocyanine pigments, indanthrone pigments, indophenolic pigments, cyanine pigments, dioxazine pigments. These can be used either singly or as combined.

The binder resin for the color filter layers may be the same as that for the fluorescent layers.

Lateral spacing of the color filter layers requires binder resin, which may be the same as that for the lateral spacing of the fluorescent layers.

The color filters which consist essentially of pigment or comprise pigment and binder resin may be patterned in the same manner as in the patterning of the fluorescent layers.

In the color filters comprising pigment and binder resin, the concentration of the pigment is not specifically defined, provided that the color filters can be patterned with no problem and can satisfactorily transmit light emission from the overlying organic EL element therethrough. In general, each color filter layer generally has a pigment concentration of from 5 to 50% by weight of its total weight, though depending on the type of the pigment therein.

(3) Light-shielding layer:

The light-shielding layers to be in the image display device of the invention are to shield light emitted by the overlying light-emitting array, thereby preventing color mixing in the device and improving the visual angle characteristic of the device.

The thickness of each light-shielding layer may be from 10 nm to 1 mm, preferably from 1 $\mu$m to 1 mm, more preferably from 10 $\mu$m to 100 $\mu$m. As has been mentioned hereinabove, in the device of the invention, fluorescent color-changing layers must be thicker than color filter layers.

Therefore, in order to unify as much as possible the thickness of the fluorescent color-changing layers and that of the light-shielding layers in the device of the invention, it is desirable that the thickness of the light-shielding layers is not smaller than 10 μm.

Regarding the lateral arrangement of the light-shielding layers, the layers may be arranged either in straight stripes or in cross stripes. For the fluorescent color-changing layers to be sandwiched between them, the light-shielding layers are preferably in cross stripes. This is because much light will leak out through the both sides of each fluorescent color-changing layer, and the light-shielding layers to be in cross stripes can block the light leak. The cross-sectional profile of each light-shielding layer is generally rectangular, but may be reversed-trapezoidal or T-shaped.

The transmittance of the light-shielding layers is preferably not larger than 10%, more preferably not larger than 1%, in the region of light to be emitted by the light-emitting array and in the region of light to be emitted by the color-changing array (especially by the fluorescent layers), or that is, in the visible ray region falling between 400 nm and 700 nm in wavelength. If the transmittance of the light-shielding layers is larger than 10%, emitted light from the light-emitting array and from the color-changing array leaks out thereby to cause color mixing in the image display device of the invention and to worsen the visible angle characteristic of the device. If desired, at least the side surfaces of the light-shielding layers may be made to be reflective.

For the material of the light-shielding layers, for example, employable are metals and black coloring matters such as those mentioned below.

The metals include, for example, Ag, Al, Au, Cu, Fe, Ge, In, K, Mg, Ba, Na, Ni, Pb, Pt, Si, Sn, W, Zn, Cr, Ti, Mo, Ta, stainless steel and their alloys. If desired, oxides, nitrides, sulfides, nitrates, sulfates and the like of those metals are also employable. Further if desired, carbon may be added to those metallic materials.

The metallic material may be applied onto a light-transmissive substrate to form a film thereon through sputtering, vapor deposition, CVD, ion-plating, electro-deposition, electro-plating, chemical plating or the like, and the film is thereafter patterned through photolithography or the like to form a pattern of light-shielding layers as laterally spaced on the substrate.

The black coloring matters include, for example, carbon black, titanium black, aniline black, and also black dye prepared by mixing the color filter coloring matters mentioned above.

The black coloring matters or the metallic material is dissolved or dispersed in binder resin such as that used in preparing the color-changing layers to give a solid mixture, which is then patterned on a substrate in the same manner as in the patterning of the color-changing layers to form a pattern of light-shielding layers on the substrate.

(4) Light-transmissive medium:

In the device of the invention, if desired, a light-transmissive medium is provided between the color-changing array and the light-emitting array. Also if desired, thin color-changing layers and thin ligbe-shielding layers may be separated from the substrate via a light-transmissive medium; or thick color-changing layers may be partly embedded in a light-transmissive medium at their bottom. Further if desired, a light-transmissive medium may be added to some color-changing layers. The light-transmissive medium to be used preferably has a transmittance of not smaller than 50% in the region between 400 nm and 700 nm in wavelength. More preferably, the medium is an electrically insulative one.

Where the light-transmissive medium is provided between the color-changing array and the light-emitting array, it may be a single-layered one or a multi-layered one. The light-transmissive medium may be in any of solid, liquid and vapor phases.

Where the light-transmissive medium is a polymer layer, the polymer may include, for example, photo-curable resins and/or thermo-curable resins having reactive vinyl groups, such as acrylate resins and methacrylate resins.

In addition, also usable for the medium are oligomers and polymers of melamine resins, phenolic resins, alkyd resins, epoxy resins, polyurethane resins, polyester resins, maleic acid resins and polyamide resins; polymethyl methacrylates, polyacrylates, polycarbonates, polyvinyl alcohols, polyvinyl pyrrolidones, hydroxyethyl celluloses, carboxymethyl celluloses and other transparent resins; and various fluorine-containing polymers.

In order to increase the light resistance of the fluorescent layers, ultraviolet absorbent may be added to the light-transmissive medium.

For inorganic oxides capable of being formed into a layer of the light-transmissive medium, for example, mentioned are silicon oxide ($SiO_2$), aluminium oxide ($Al_2O_3$), titanium oxide ($TiO_2$), yttrium oxide ($Y_2O_3$), germanium oxide ($GeO_2$), zinc oxide (ZnO), magnesium oxide (MgO), calcium oxide (CaO), boron oxide ($B_2O_3$), strontium oxide (SrO), barium oxide (BaO), lead oxide (PbO), zirconia ($ZrO_2$), sodium oxide ($Na_2O$), lithium oxide ($Li_2O$) and potassium oxide ($K_2O$).

Glass is also employable for the inorganic oxide layer of the light-transmissive medium.

For this, for example, employable is any of soda lime glass, barium-strontium glass, lead glass, aluminosilicate glass, borosilicate glass, and barium borosilicate glass. The inorganic oxide layer as referred to herein may be any and every one consisting essentially of an inorganic oxide, and may additionally contain a nitride (e.g., $Si_3N_4$).

To adhere the light-emitting array and the color-changing array, employable are adhesives such as those mentioned below.

As the adhesives, concretely mentioned are photo-curable and thermo-curable adhesives having reactive vinyl groups, such as acrylic acid-type oligomers and methacrylic acid-type oligomers; and moisture-curable adhesives such as 2-cyanoacrylates. Also employable are thermosetting and chemically-curable, two-component adhesives such as epoxy adhesives.

As examples of the vapor-phase or liquid-phase, light-transmissive medium for use in the invention, mentioned are inert gases such as nitrogen and argon, and inert liquids such as fluourohydrocarbons and silicone oils. If desired, the light-transmissive medium may be in vacuum.

For the solid-phase, light-transmissive medium for use in the invention, it may be dissolved or dispersed in a suitable solvent to be in liquid, and the resulting liquid medium may be formed into a film, for example, through spin-coating, roll-coating or casting. Alternatively, the solid-phase, light-transmissive medium may be directly formed into a film, for example, through sputtering, vapor deposition, CVD or ion-plating. Sheet glass, if used as the light-transmissive medium, may be fixed with an adhesive such as that mentioned above.

The inert liquid and the inert gas may be introduced into the image display device, while sealing the region except the light-emitting array area.

As the light-transmissive medium to be in the interface adjacent to the organic EL element, preferred is the inorganic oxide layer or the inert liquid or gas such as that mentioned hereinabove, as being able to block water and oxygen that may promote the deterioration of the organic EL element.

The light-transmissive medium may be provided between thin color-changing layers and the substrate, or thick color-changing layers may be partly embedded in the light-transmissive medium at their bottom. For the former, for example, a photo-curable resin and/or a thermo-curable resin such as those mentioned hereinabove may be patterned on the substrate through photolithography or printing to form, on the substrate, a pattern of the intended light-transmissive medium having a predetermined thickness, before or after the formation of the light-shielding layers on the substrate. In this, thin color-changing layers are formed above the thus-formed pattern of the light-transmissive medium. For the latter, grooves having a predetermined depth are formed according to the patterning of the light-transmissive medium using the photo-curable resin and/or the thermo-curable resin, and thick color-changing layers are formed to be partly embedded in those grooves at their bottom.

Some color-changing layers may contain the light-transmissive medium. For this, a solid material of the medium such as that mentioned hereinabove may be added to the color-changing layers in addition to the binder resin or the pigment resin. The solid material may be dissolved or dispersed in the material of the color-changing layers.

(5) Light-emitting array:

As the light-emitting array for use in the invention, preferred are thin organic EL elements for surface emission. This is because, for such organic EL elements, plenty of various organic compounds are employable to produce high-luminance light of different colors at high efficiency. Apart from organic EL elements, also usable herein are other sources of inorganic ELD, LED, VFD, PDP, and, as the case may be, even LCD.

The organic EL elements for use in the invention at least have an organic layer of a recombination region and a light-emitting region. The recombination region and the light-emitting region are generally in the light-emitting layer of organic EL elements. Therefore, the organic EL elements for use in the invention may have an organic, light-emitting layer only. If desired, however, they may additionally have other layers except the organic, light-emitting layer, such as a hole-injecting layer, an electron-injecting layer, an organic semiconductor layer, an electron barrier layer, and an adhesion-improving layer.

Some typical constitutional examples of organic EL elements usable in the invention are mentioned below, which, however, are not limitative.

① Anode/light-emitting layer/cathode
② Anode/hole-injecting layer/light-emitting layer/cathode
③ Anode/light-emitting layer/electron-injecting layer/cathode
④ Anode/hole-injecting layer/light-emitting layer/electron-injecting layer/cathode
⑤ Anode/organic semiconductor layer/light-emitting layer/cathode
⑥ Anode/organic semiconductor layer/electron barrier layer/light-emitting layer/cathode
⑦ Anode/hole-injecting layer/light-emitting layer/adhesion-improving layer/cathode Of those, generally preferred is the constitution ④.

(5)-1. Anode:

For the anode, preferred is an electrode material having a high work function (not lower than 4 eV). For the electrode material, for example, employable are metals, alloys, electroconductive compounds and their mixtures. Specific examples of the electrode material are metals such as Au, and electroconductive materials such as CuI, ITO, $SnO_2$ and ZnO.

The anode may be formed through vapor deposition or sputtering of any of those electrode materials to give a thin film.

Where emitted light from the light-emitting layer is taken out through the anode, it is desirable that the transmittance of the anode for the emitted light is larger than 10%. The sheet resistance of the anode is preferably not larger than several hundreds Ω/square. Though depending on the electrode material, the thickness of the electrode may be generally from 10 nm to 1 μm, but preferably from 10 to 200 nm.

(5)-2. Light-emitting layer:

Organic compounds are essentially used as the light-emitting materials for organic EL elements. Depending on the intended color, compounds mentioned below can be used.

For ultraviolet to violet emission, usable are compounds of the following general formula:

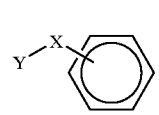

[1]

wherein X represents a group of:

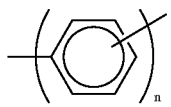

[2]

with n being 2, 3, 4 or 5; and
Y represents a group of

[3]

In those compounds, the phenyl, phenylene and naphthyl groups may have one or more substituents of, for example, alkyl or alkoxy group having from 1 to 4 carbon atoms, hydroxyl group, sulfonyl group, carbonyl group, amino group, dimethylamino group and diphenylamino group. As the case may be, those substituents may be bonded to each other to form a saturated, 5-membered or 6-membered ring. Preferably, the phenyl, phenylene or naphthyl group is substituted at its para-position, since the bonding between the group and the substituent is good and since the compounds are favorably formed into smooth films through vapor deposition. Specific examples of the compounds are mentioned below. Of those, preferred are p-quater-phenyl derivatives and p-quinque-phenyl derivatives.

[4]
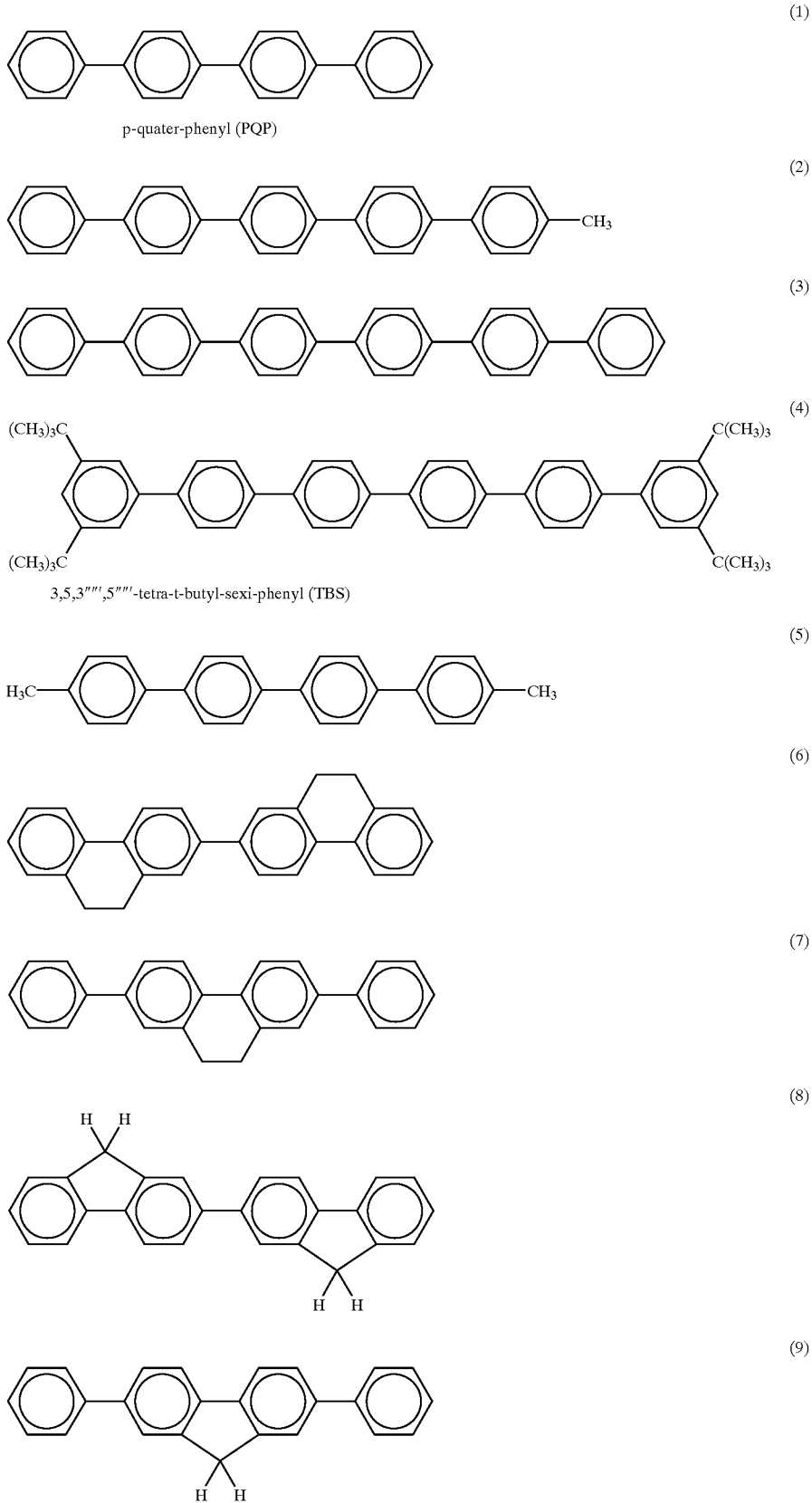

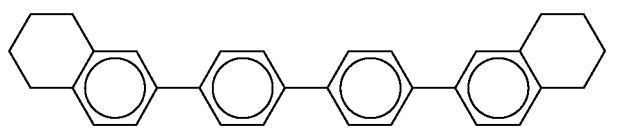
(10)

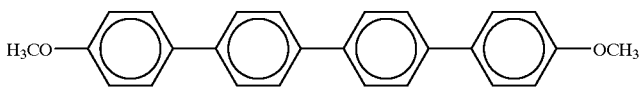
(11)

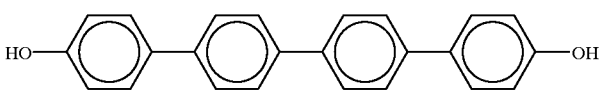
(12)

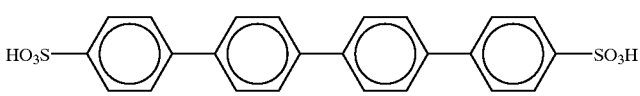
(13)

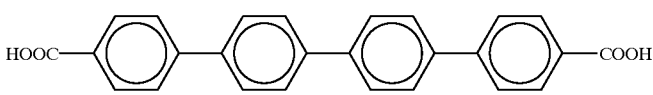
(14)

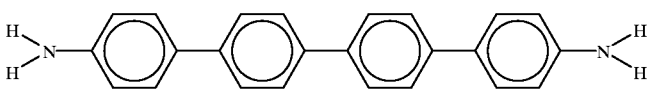
(15)

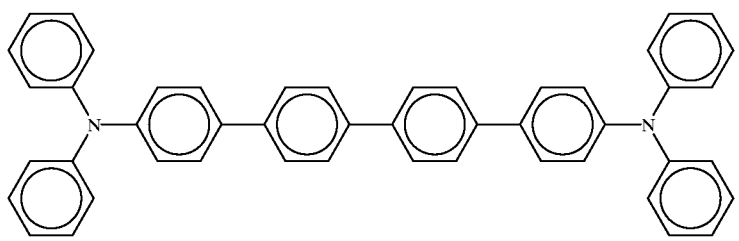
(16)

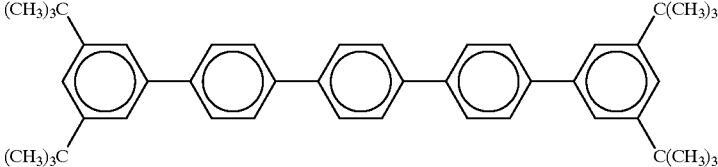
(17)

3,5,3''''',5'''''-tetra-t-butyl-p-quinque-phenyl (TBQ)

For blue to green emission, for example, usable are fluorescent brighteners such as benzothiazole compounds, benzimidazole compounds and benzoxazole compounds, and also metal-chelated oxonoid compounds and styrylbenzene compounds.

Concretely mentioned are the compounds disclosed in JP-A 59-194393. Specific examples of the compounds are fluorescent brighteners such as benzoxazole compounds, benzothiazole compounds and benzimidazole compounds.

Other compounds also usable in the invention are listed in Chemistry of Synthetic Dyes, 1971, pp. 628–637 and 640. Chelated oxonoid compounds are described in JP-A 63-295695, which are usable in the invention. Specific examples of the compounds are 8-hydroxyquinoline-metal complexes such as tris(8-quinolinol)aluminium (hereinafter referred to as Alq), and also dilithium epintridione.

Styrylbenzene compounds are described in EP 0319881 and EP 0373582, which are usable in the invention.

Distyrylpyrazine derivatives described in JP-A 2-252793 are also usable as the material of the light-emitting layers of the invention.

Further, polyphenyl compounds described in EU 0387715 are also usable as the material of the light-emitting layers of the invention.

In addition to the fluorescent brighteners, metal-chelated oxonoid compounds and styrylbenzene compounds mentioned hereinabove, the following compounds are also usable as the material of the light-emitting layers of the invention.

12-Phthaloperinone (see J. Appl. Phys., Vol. 27, L713, 1988);

1,4-Diphenyl-1,3-butadiene, and 1,1,4,4-tetraphenyl-1,3-butadiene (see Appl. Phys. Lett., Vol. 56, L799, 1990);

Naphthalimide derivatives (see JP-A 2-305886);

Perylene derivatives (see JP-A 2-189890);

Oxadiazole derivatives (see JP-A 2-216791);

Oxadiazole derivatives (disclosed by Hamada et al., the 38th Joint Lecture Meeting of the Applied Physics Society of Japan);

Aldazine derivatives (see JP-A 2-220393);

Pyrazyline derivatives (see JP-A 2-220394);

Cyclopentadiene derivatives (see JP-A 2-289675);

Pyrrolopyrole derivatives (see JP-A 2-296891); Styrylamine derivatives (see Appl. Phys. Lett., Vol. 56, L799, 1990);

Coumarin compounds (see JP-A 2-191694);

Polymer compounds (described in International Patent Laid-Open No. WO90/1314, and Appl. Phys. Lett., Vol. 58, 18 P1982, 1991).

As the material of the light-emitting layers of the invention, especially preferred are aromatic dimethylidene compounds (such as those described in EP 0388768 and JP-A 3-231970). Specific examples of the compounds are the following:

4,4,'-Bis(2,2-di-t-butylphenylvinyl)biphenyl (hereinafter referred to as DTBPBBi), 4,4'-bis(2,2-diphenylvinyl)biphenyl (hereinafter referred to as DPVBi), and their derivatives.

Also usable are compounds of a general formula, (Rs—Q)$_2$—Al—O—L, which are described in JP-A 5-258862. In the formula, L represents a hydrocarbon residue having a phenyl moiety and having from 6 to 24 carbon atoms; O—L represents a phenolato ligand; Q represents a substituted 8-quinolinolato ligand; and Rs represents a substituent to be on the 8-quinolinolato ring and is so selected as to sterically interfere with the bonding of more than two substituted 8-quinolinolato ligands to the aluminium atom. Specific examples of the compounds are the following:

Bis(2-methyl-8-quinolinolato)(para-phenylphenolato) aluminium(III) (hereinafter referred to as PC-7), and bis(2-methyl-8-quinolinolato)(1-naphtholato) aluminium (III) (hereinafter referred to as PC-17).

In addition to the above, also employable herein is a doping method for high-efficiency blue/green mixed emission, such as that described in JP-A 6-9953. In this method, any of the light-emitting materials mentioned hereinabove is used as the host, while, as the dopant, used is any of strong fluorescent dyes for blue to green emission, for example, coumarin dyes or fluorescent dyes that are similar to those to be used as the host. Specific examples of the host are distyrylarylene skeleton-based luminescent materials, such as preferably DPVBi; and those of the dopants are diphenylaminovinylarylenes, such as preferably N,N-diphenylaminovinylbenzene (DPAVB).

The structure of the light-emitting layers for white emission is not specifically defined. Some examples of the structure are mentioned below.

① An organic EL laminate structure for tunnel injection, in which the energy level of each layer is defined for white emission (see EP 0390551).

② The same structure for tunnel injection for white emission as in ① (see JP-A 3-230584, in which is illustrated a white-emitting device in Example).

③ A two-layered, white-emitting structure (see JP-A 2-220390 and JP-A 2-216790).

④ A white-emitting structure composed of a plurality of different light-emitting layers, in which each layer is made of a different material for different wavelength emission (see JP-A 4-51491).

⑤ A white-emitting laminate structure composed of a blue-emitting layer (for fluorescence peak emission of from 380 nm to 480 nm) and a green-emitting layer (from 480 nm to 580 nm), and containing a red-emitting phosphor (see JP-A 6-207170).

⑥ A white-emitting laminate structure comprising a region of a blue-emitting layer that contains a blue phosphor pigment, and a region of a green-emitting layer that contains a red phosphor, and containing a green phosphor (see JP-A 7-142169).

Of those, preferred is the structure ⑤.

Examples of red phosphors are mentioned below.

[8]

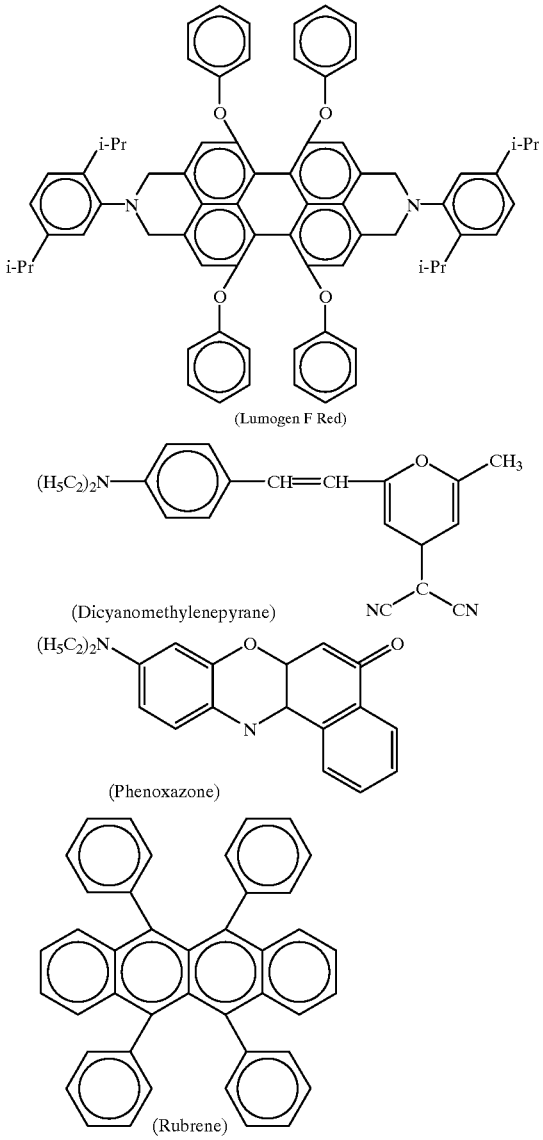

To form the light-emitting layers of the materials mentioned above, for example, employable are any conventional techniques of vapor deposition, spin-coating or LB. The light-emitting layers are especially preferably molecular sedimentary films. The molecular sedimentary film as referred to herein is a thin film as formed through deposition of a vapor-phase compound or a film as formed through solidification of a solution of a compound or of a liquid-phase compound, and is generally differentiated from a thin film of a molecular built-up film to be formed through LB in point of the aggregation structure and the high-order molecular structure of the films, and also in point of the different functions of the films that are intrinsic to such different structures.

As in JP-A 57-51781, a solution of a compound as dissolved in a binder such as resin may be formed into a thin film through spin-coating or the like to give a light-emitting layer.

The thickness of the light-emitting layer to be formed in the manner mentioned above is not specifically defined and may be varied case by case. In general, however, the thickness is preferably from 5 nm to 5 μm.

The light-emitting layers of the organic EL elements have all of the following three functions, ① injecting function, ② transporting function and ③ light-emitting function. The injecting function ① is to inject holes into the layer from the anode or from the hole-injecting layer, and to inject electrons thereinto from the cathode or from the electron-injecting layer, while the device is in an electric field. The transporting function ② is to move the thus-injected charges (electrons and holes) in the layer by the force of the electric field. The light-emitting function ③ is to provide the site for recombination of those electrons and holes for light emission. The degree of hole injection into each light-emitting layer may differ from that of electron injection thereinto, and the light-emitting layers may have different transportation capabilities that are indicated by the mobility of holes and electrons through the layers. Preferably, the light-emitting layers have the capability of moving either one type of charges, hole and electron.

(5)-3. Hole-injecting layer:

The hole-injecting layer is not always necessary for the device of the invention, but preferably the device has the hole-injecting layer for improved emission. The hole-injecting layer is to assist the hole injection into the light-emitting layer, and this has a large degree of hole mobility but has a small ionizing energy of generally not larger than 5.5 eV. For the hole-injecting layer, preferred is a material capable of transporting holes into light-emitting layers even in a small electric field. More preferably, the hole mobility through the hole-injecting layer is at least $10^{-6}$ cm$^2$/V·sec in an electric field of from $10^4$ to $10^6$ V/cm.

The material for the hole-injecting layer is not specifically defined, provided that it has the desired properties. It may be selected from any conventional, photo-conductive, hole-transporting materials that are known usable in hole-injecting layers of ordinary EL elements.

Specific examples of the material for the hole-injecting layer are mentioned below.

Triazole derivatives (see U.S. Pat. No. 3,112,197);

Oxadiazole derivatives (see U.S. Pat. No. 3,189,447);

Imidazole derivatives (see JP-B 37-16096);

Polyarylalkane derivatives (see U.S. Pat. No. 3,615,402, 3,820,989 and U.S. Pat. No. 3,542,544, JP-B 45-555 and 51-10983, JP-A 51-93224, 55-17105, 56-4148, 55-108667, 55-156953 and 56-36656);

Pyrazoline derivatives and pyrazolone derivatives (see U.S. Pat. No. 3,180,729 and 4,278,746, JP-A 55-88064, 55-88065, 49-105537, 55-51086, 56-80051, 56-88141, 57-45545, 54-112637 and 55-74546);

Phenylenediamine derivatives (see U.S. Pat. No. 3,615,404, JP-B 51-10105, 46-3712 and 47-25336, JP-A 54-53435, 54-110536 and 54-119925);

Arylamine derivatives (see U.S. Pat. Nos. 3,567,450, 3,180,703, 3,240,597, 3,658,520, 4,232,103, 4,175,961 and 4,012,376, JP-B 49-35702 and 39-27577, JP-A 55-144250, 56-119132 and 56-22437, German Patent 1,110,518);

Amino-substituted chalcone derivatives (see U.S. Pat. No. 3,526,501);

Oxazole derivatives (see U.S. Pat. No. 3,257,203);

Styrylanthracene derivatives (see JP-A 56-46234);

Fluorenone derivatives (see JP-A 54-110837);

Hydrazone derivatives (see U.S. Pat. Nos. 3,717,462, JP-A 54-59143, 55-52063, 55-52064, 55-46760, 55-85495, 57-11350, 57-148749 and 2-311591);

Stilbene derivatives (see JP-A 61-210363, 61-228451, 61-14642, 61-72255, 62-47646, 62-36674, 62-10652, 62-30255, 60-93445, 60-94462, 60-174749 and 60-175052);

Silazane derivatives (see U.S. Pat. No. 4,950,950);

Polysilane derivatives (see JP-A 2-204996);

Aniline copolymers (see JP-A 2-282263);

Electroconductive, high-molecular oligomers, especially thiophene oligomers (see JP-A 1-211399).

Apart from the materials mentioned hereinabove for the hole-injection layer, more preferred are porphyrin compounds; aromatic tertiary amine compounds and styrylamine compounds (such as those described in U.S. Pat. No. 4,127,412, JP-A 53-27033, 54-58445, 54-149634, 54-64299, 55-79450, 55-144250, 56-119132, 61-295558, 61-98353 and 63-295695). Of those, even more preferred are aromatic tertiary amine compounds.

Also usable are compounds having two condensed aromatic rings in the molecular, such as those described in U.S. Pat. No. 5,061,569. One example of the compounds is 4,4'-bis[N-(1-naphthyl)-N-phenylamino]biphenyl (hereinafter referred to as NPD). Further usable is 4,4',4"-tris[N-(3-methylphenyl)-N-phenylamino]triphenylamine (hereinafter referred to as MTDATA) in which the three triphenylamine units are bonded in a starburst form. This is disclosed in JP-A 4-308688.

Aromatic dimethylidene compounds such as those mentioned hereinabove for the material of light-emitting layers, as well as inorganic compounds such as p-type Si and p-type SiC are also usable as the material of the hole-injecting layer.

To form the hole-injecting layer, any of the compounds mentioned hereinabove may be formed into a thin film by conventional techniques of, for example, vacuum vapor deposition, spin-coating, casting or LB. The thickness of the hole-injecting layer is not specifically defined, but may be generally from 5 nm to 5 μm. The hole-injecting layer may be a single-layered one composed of one or more of the compounds mentioned hereinabove, or may be a multi-layered one as formed by laminating different hole-injecting layers of different compounds.

The organic semiconductor layer is to assist the hole injection or the electron injection into the light-emitting layers, and preferably has an electroconductivity of not smaller than $10^{-10}$ S/cm. As the material for the organic semiconductor layer, employable are electroconductive oligomers such as thiophene-containing oligomers and arylamine-containing oligomers, and electroconductive dendrimers such as arylamine-containing dendrimers.

(5)-4. Electron-injecting layer:

The electron-injecting layer is to assist the electron injection into the light-emitting layers, and has a large degree of electron mobility. The adhesion-improving layer, which is one type of the electron-injecting layer, is made of a material having high adhesiveness to the adjacent cathode. The material to be used for forming the electron-injecting layer includes, for example, metal complexes with 8-hydroxyquinoline or its derivatives, and also oxadiazole derivatives. As the material for the adhesion-improving layer, especially preferred are metal complexes of 8-hydroxyquinoline or its derivatives.

As specific examples of the metal complexes with 8-hydroxyquinoline or its derivatives, mentioned are metal-chelated oxonoid compounds having a chelate of oxine (generally, 8-quinolinol or 8-hydroxyquinoline).

For example, Alq mentioned above can be used to form the electron-injecting layer.

wherein $Ar^{10}$ to $Ar^{13}$ each represent a substituted or unsubstituted aryl group, provided that $Ar^{10}$ and $Ar^{11}$, and $Ar^{12}$ and $Ar^{13}$ each may be the same or different; and $Ar^{14}$ represents a substituted or unsubstituted arylene group.

The aryl group includes, for example, phenyl, biphenyl, anthranyl, perylenyl and pyrenyl groups. The arylene group includes, for example, phenylene, naphthylene, biphenylene, anthracenylene, perylenylene and pyrenylene groups. As the substituents for these groups, mentioned are an alkyl group having from 1 to 10 carbon atoms, an alkoxy group having from 1 to 10 carbon atoms, and a cyano group. The electron-transmitting compounds preferably have the ability to form thin films.

Specific examples of the electron-transmitting compounds are mentioned below.

[10]

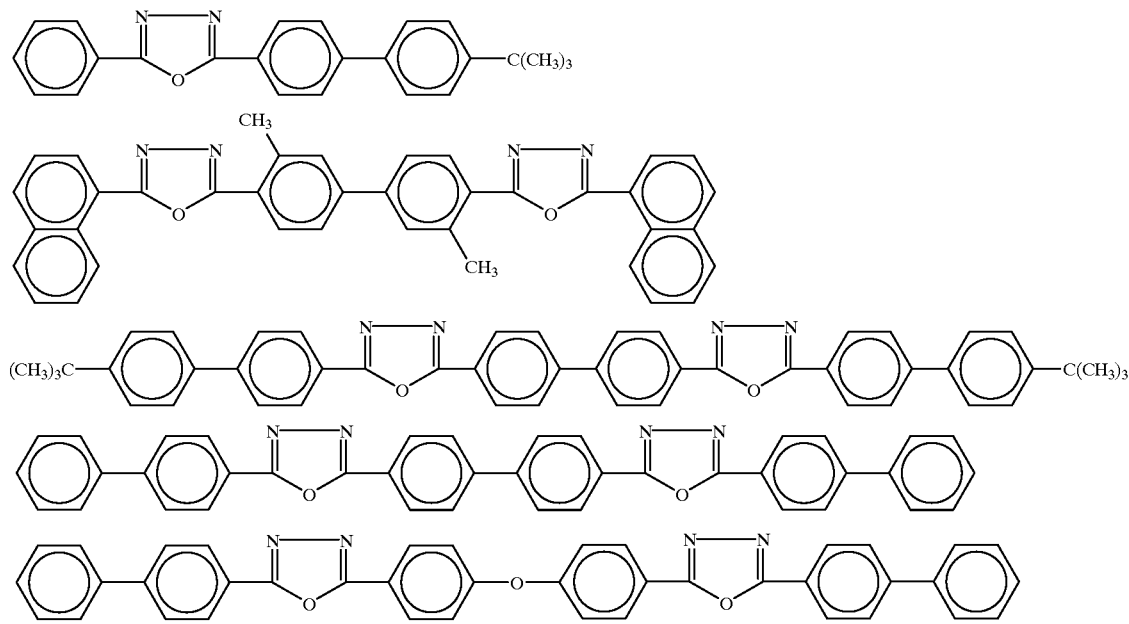

As specific examples of the oxadiazole derivatives, mentioned are electron-transmitting compounds of the following general formulae (II), (III) and (IV):

[9]

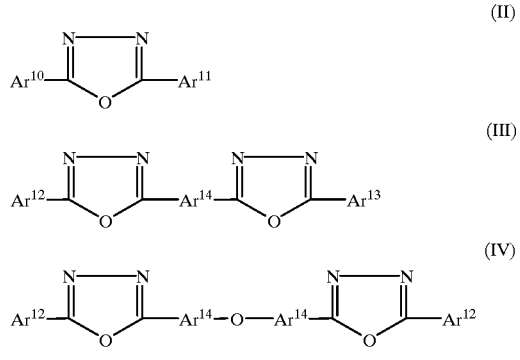

(5)-5. Cathode:

For the cathode, used is an electrode material having a low work function (not higher than 4 eV). For the electrode material, for example, employable are metals, alloys, electroconductive compounds and their mixtures. Specific examples of the electrode material are sodium, sodium-potassium alloys, magnesium, lithium, magnesium—silver alloys, aluminium/aluminium oxide ($Al_2O_3$), aluminium-lithium alloys, indium, and rare earth metals.

The cathode may be formed through vapor deposition or sputtering of any of those electrode materials to give a thin film.

The sheet resistance of the cathode is preferably not larger than several hundreds Ω/square. Though depending on the electrode material, the thickness of the cathode may be generally from 10 nm to 1 μm, but preferably from 50 to 200 nm. In the EL elements for use in the invention, either one of the anode and the cathode is preferably transparent or semi-transparent for efficient emission, since emitted light from the light-emitting layers can pass through such a transparent or semi-transparent electrode.

(5)-6. Example of construction of organic EL element:

Using the materials mentioned hereinabove and according to the methods also mentioned hereinabove, the anode, the light-emitting layer, the optional hole-injecting layer, the optional electron-injecting layer, and the cathode are formed in that order to produce an organic EL element. Alternatively, those layers may be formed in the reversed order of from the cathode to the anode, also to produce an organic EL element.

One example of constructing an organic EL element having a constitution of anode/hole-injecting layer/light-emitting layer/electron-injecting layer/cathode on a substrate is mentioned below.

First, a anode material is applied onto a suitable substrate through vapor deposition or sputtering to form, on the substrate, a thin film of a anode having a thickness of not larger than 1 μm, preferably from 10 to 200 nm. Next, a hole-injecting layer is provided over the anode. The formation of the hole-injecting layer may be effected through vacuum vapor deposition, spin-coating, casting or LB, as so mentioned hereinabove. However, preferred is vacuum vapor deposition, as producing a homogeneous film with few pin holes. The condition for the vacuum vapor deposition to form the hole-injecting layer varies, depending on the compound (that is, the material of the hole-injecting layer) used, and on the crystalline structure and the recombination structure of the hole-injecting layer to be formed. In general, it is desirable that the temperature of the vapor source falls between 50 and 450° C., that the vacuum degree falls between $10^{-7}$ and $10^{-3}$ Torr, that the deposition rate falls between 0.01 and 50 nm/sec, and that the temperature of the substrate falls between −50 and 300° C. In this preferred condition, the film of the hole-injecting layer formed may have a thickness of from 5 nm to 5 μm.

Next, a light-emitting layer is provided over the hole-injecting layer. To form the light-emitting layer, used is a desired, organic luminescent material, which may be formed into a thin film through vacuum vapor deposition, sputtering, spin-coating or casting. For this, preferred is vacuum vapor deposition, as producing a homogeneous film with few pin holes. The condition for the vacuum vapor deposition to form the light-emitting layer varies, depending on the compound used. In general, the condition may be the same as that for the vacuum vapor deposition of the hole-injecting layer.

Next, an electron-injecting layer is provided over the light-emitting layer. For this, preferred is vacuum vapor deposition to form a homogeneous film, like for the formation of the hole-injecting layer and the light-emitting layer. The condition for the vacuum vapor deposition to form the electron-injecting layer may be the same as that for the formation of the hole-injecting layer and the light-emitting layer.

Last, a cathode is laminated over the electron-injecting layer to finally obtain the intended organic EL element.

The cathode is composed of a metal, which may be formed through vapor deposition or sputtering. In order to protect the underlying organic layers, preferred is vacuum vapor deposition for the formation of the cathode.

It is desirable that the organic EL element is produced in one vacuum system in which the process from the formation of the anode to the formation of the cathode is continuously effected.

For direct current mode emission, a DC voltage of from 5 to 40 V is applied to the organic EL element with its anode being charged in plus (+) and its cathode in minus (−) to give emission. If, however, DC voltage is applied to the device in the opposite polarity, no current passes through the device to give emission. For alternating current mode emission, the device produces uniform emission only when its anode is charged in plus (+) with its cathode in minus (−). For this, employable is any AC waveform.

The organic EL element comprising a plurality of light-emitting layers as laterally spaced on a substrate is applicable to any of two systems, an X–Y dot matrix system in which the anode and the cathode are formed in stripes that intersect with each other and DC voltage is applied to each electrode to thereby make the intersecting points emit light, and an active matrix system in which either of the anode and the cathode is formed in dots and DC voltage is applied to only some specific dots via a switching device such as TFT (thin film transistor) to thereby make the specific dots emit light. The anode and the cathode are formed in stripes or dots by etching them in photolithography or by lifting off them, or through masking vapor deposition.

Now, the invention is described in more detail herein under, with reference to the following Examples, which, however, are not intended to restrict the scope of the invention.

EXAMPLE 1

This is to demonstrate the embodiment of polishing the surface of the color-changing array to planarize it.

As the light-transmissive substrate, used was a glass substrate (Corning 7059) having a size of 100 mm×100 mm×1.1 mm (thickness). A photo-curable acrylate resist containing 3% by weight, in terms of its solid content, of carbon black as dispersed therein and having a viscosity of 250 cps was applied onto the glass substrate by spin-coating and then baked at 80° C. This was set in an exposing device equipped with a high-pressure mercury lamp as the light source. Next, this was exposed at 900 mJ/cm$^2$ (365 nm) via a mask to give a stripe pattern of 50 μm line and 250 μm gap. After the exposure, this was developed with an aqueous solution of 1 wt. % sodium carbonate at room temperature for 2 minutes. Next, this was post-exposed at 3000 mJ/cm$^2$ throughout its entire surface from the side of the glass substrate, and baked at 200° C. to form a pattern of light-shielding layers on the substrate. The thickness of the patterned light-shielding layer was 20 μm.

Next, the substrate was set in a screen printer, in which ink (having a viscosity of 8000 cps), which had been prepared by mixing and dispersing 2.8% by weight, in terms of its solid content, of copper phthalocyanine pigment (C.I. Pigment Blue 15:6), 0.2% by weight, in terms of its solid content, of dioxazine pigment (C.I. Pigment Violet 23) and 97% by weight of a binder, polyvinyl chloride resin (having a weight-average molecular weight of 20,000) in a solvent of cyclohexanone, was applied into predetermined gaps in the light-shielding layer pattern on the substrate, using a printing plate for giving a stripe pattern of 250 μm×650 μm (gap), and baked at 80° C. to form a blue filter pattern. The thickness of the patterned blue filter was about 15 μm.

Next, the printing plate was moved by 300 μm in parallel to the substrate in the direction perpendicular to the stripe arrangement of the blue filter layer pattern. Ink (having a viscosity of 8000 cps) that had been prepared by dissolving Coumarin 6 and a binder, polyvinyl chloride resin (having a weight-average molecular weight of 20,000) in a solvent, cyclohexanone, the amount of Coumarin 6 being 0.03 mols relative to 1 kg of the binder resin, was applied into other predetermined gaps in the light-shielding layer pattern, using the thus-moved printing plate, and baked at 80° C. to form a pattern of fluorescent layer A. The thickness of the patterned fluorescent layer A was about 15 µm.

Next, the printing plate was further moved by 300 µm in parallel to the substrate in the direction perpendicular to the stripe arrangement of the patterned fluorescent layer A. Ink was prepared by dissolving Coumarin 6, a fluorescent pigment that had been prepared by kneading 4% by weight, relative to benzoguanamine resin, of Rhodamine 6G and 4% by weight, relative to benzoguanamine resin, of Rhodamine B with benzoguanamine resin, and a binder, polyvinyl chloride resin (having a weight-average molecular weight of 200,000) in a solvent, cyclohexanone, in which the amount of Coumarin 6 was 0.03 mols relative to the sum of the fluorescent pigment and the polyvinyl chloride resin binder of being 1 kg, and the ratio of the fluorescent pigment to the polyvinyl chloride resin binder was 30/70 by weight. The thus-prepared ink had a viscosity of 8000 cps. The ink was applied into the remaining gaps in the light-shielding layer pattern, using the thus-moved printing plate, and baked at 80° C. to form a pattern of fluorescent layer B. The thickness of the patterned fluorescent layer B was about 20 µm.

Next, the surface of the color-changing array thus formed on the substrate was lapped with No. 800 sandpaper, while spraying pure water thereonto, and was further polished with a fine alumina abrasive, using a rotary grinder (manufactured by Speed Fam Co.), while still spraying pure water thereonto.

As a result of this process, the color-changing array was polished and planarized, as in FIG. 7(b), and its surface roughness was measured with a surface roughness meter (DEKTAK 3030) to be 0.2 µm. In the thus-planarized color-changing array, the thickness of the color-changing layers, blue filter layers and fluorescent layers A and B, was unified to be about 15 µm.

In order to confirm the luminance and the chromaticity of light originally emitted by the organic EL element, which is laminated over the color-changing array, small parts of the light-shielding layer pattern and the color-changing layer patterns of the color-changing array were cut off from the array.

Next, a light-transmissive medium, silicon oxide ($SiO_2$) was sputtered onto the color-changing array in a vacuum of $10^{-6}$ Torr, while heating the substrate at 160° C. The thickness of the silicon oxide film thus formed was 0.5 µm.

After having been thus coated with the silicon oxide film, the surface roughness of the color-changing array did not change and was still 0.2 µm.

Next, an organic EL element was superposed on the light-transmissive, silicon oxide layer, in the manner mentioned below.

First, the substrate was heated at 160° C., and a transparent electrode (anode) was formed over the silicon oxide film by sputtering ITO (indium tin oxide) in a vacuum of $10^{-6}$ Torr. The thus-formed electrode had a thickness of 0.15 µm and a sheet resistance of 20 Ω/square.

Next, a positive photoresist, HPR204 (manufactured by Fuji-Hunt Electronics Technology Co.) was applied onto the ITO layer by spin-coating, and baked at 80° C. Using an exposing device, this was exposed at 100 mJ/cm² via a mask capable of forming a stripe pattern of ITO of 250 µm line and 50 µm gap in alignment with the light-shielding layer pattern.

Next, this was developed with an aqueous solution of 2.38 wt. % TMAH (tetramethylammonium hydroxide) to remove the non-exposed resist, and then post-baked at 120° C. to form a resist pattern.

Next, the substrate was dipped in an aqueous solution of 47 wt. % hydrogen bromide at room temperature, in which the ITO film not covered with the resist pattern was etched. After this, the resist was peeled off. Thus was formed a stripe pattern of ITO of 250 µm line and 50 µm gap.

Next, the substrate was washed with IPA and then with UV rays, and mounted on a substrate holder in a vapor deposition device (manufactured by ULVAC Co.), in which resistance heating boats of molybdenum were filled with sources for vapor deposition. Precisely, the sources in those boats were a hole-injecting material of MTDATA and NPD, a light-emitting material of DPVBi, a dopant of DPAVB, and an electron-injecting material of Alq. In addition, a second metal for the cathode, Ag was set around tungsten filaments, and an electron-injecting metal for the cathode, Mg was put in a different molybdenum boat in the device.

The vacuum chamber of the device was degassed to have a vacuum degree of $5 \times 10^{-7}$ Torr, in which all the intended layers were continuously deposited one after another in the predetermined order mentioned below. During this continuous vapor deposition, the vacuum degree was all the time kept as it was in the vacuum chamber. Precisely, MTDATA was first deposited at a vapor deposition rate of from 0.1 to 0.3 nm/sec to form a film having a thickness of 200 nm, and then NPD was deposited at from 0.1 to 0.3 nm/sec to form a film having a thickness of 20 nm. Thus was formed a hole-injecting layer. Next, DPVBI and DPAVB were co-deposited at a rate of from 0.1 to 0.3 nm/sec and at a rate of 0.05 nm/sec, respectively, to form a light-emitting layer having a thickness of 40 nm. In this, the ratio by weight of the dopant to the host material was from 1.2 to 1.6. Next, Alq was deposited at a rate of from 0.1 to 0.3 nm/sec to form an electron-injecting layer having a thickness of 20 nm. Last, Mg and Ag were co-deposited via a mask capable of forming a stripe pattern of 600 µm line and 100 µm gap that is perpendicular to the stripe pattern of the anode ITO. For this, Mg was deposited at a rate of from 1.3 to 1.4 nm/sec, while Ag was at a rate of 0.1 nm/sec, to form a cathode pattern having a thickness of 200 nm.

In that manner, formed was an organic EL image display device, as in FIG. 3. A direct current voltage of 8 V was applied to the device between the anode and the cathode, whereupon the device emitted light at the intersections of the thus-charged cathode and anode. The luminance and the CIE chromaticity (as designated in JIS Z 8701) of blue light originally emitted by the organic EL element, which was seen at the part at which the light-shielding layer and the color-changing layers had been cut off, were found to be 100 cd/m², and x=0.16 and y=0.24, respectively.

On the other hand, pure blue emission was seen through the blue filter layer. Its luminance was 50 cd/m², and its CIE chromaticity was x=0.14 and y=0.16.

Yellowish green emission was seen through the fluorescent layer A. Its luminance was 113 cd/m², and its CIE chromaticity was x=0.23 and y=0.65.

Red emission was seen through the fluorescent layer B. Its luminance was 22 cd/m², and its CIE chromaticity was x=0.55 and y=0.29.

As in the above, the organic EL image display device produced herein gave the intended pure emission through each color-changing layer with no color mixing.

EXAMPLE 2

This is to demonstrate the embodiment of partly embedding thick color-changing layers in the light-transmissive substrate at their bottom.

A light-shielding layer pattern was formed on a light-transmissive substrate in the same manner as in Example 1, except that the number of revolutions for the spin-coating of the carbon black-dispersed, photo-curable acrylate resist was increased. The thickness of the light-shielding layer pattern formed herein was 15 μm.

Next, a dry film resist, A-840 (manufactured by Fuji Film Co.) was laminated over the substrate, which was then set in an exposing device equipped with a high-pressure mercury lamp as the light source. Having been thus set in the exposing device, this was exposed at 60 mJ/cm$^2$ (365 nm) via a mask capable of forming a stripe pattern of 650 μm line and 250 μm gap as arranged in parallel alignment with the light-shielding layer pattern.

Next, this was developed with an aqueous solution of 1 wt. % sodium carbonate for 2 minutes at room temperature, whereby the resist pattern thus formed had openings at one of three gaps of the light-shielding stripe pattern, and the light-transmissive substrate was exposed out at those openings.

Next, the substrate was sand-blasted at the openings to have grooves (depth: 5 μm) on its surface.

Next, the substrate was processed with an aqueous solution of 3 wt. % sodium hydroxide at 50° C. for 1 minute, whereby the remaining resist was removed.

After this, the substrate was processed in the same manner as in Example 1 to form a color-changing array thereon, as in FIG. 8(a), except that the fluorescent layer pattern B was partly embedded in the grooves of the substrate at its bottom and that the color-changing array formed was not polished.

The surface roughness of the thus-formed, color-changing array was measured with a surface roughness meter (DEKTAK 3030). It was found that the color-changing array was planarized to have a surface roughness of 1.5 μm although the thickness of the blue filter layer pattern and that of the fluorescent layer A pattern were about 15 μm and the thickness of the fluorescent layer B pattern was about 20 μm.

Next, in the same manner as in Example 1, a silicon oxide layer and an organic EL element were formed over the color-changing array in that order. Thus was produced an organic EL image display device.

A direct current voltage of 8 V was applied to the device between the anode and the cathode, whereupon the device emitted light at the intersections of the thus-charged cathode and anode. The luminance and the CIE chromaticity (as designated in JIS Z 8701) of blue light originally emitted by the organic EL element, which was seen at the part at which the light-shielding layer and the color-changing layers had been cut off, were found to be 100 cd/m$^2$, and x=0.16 and y=0.24, respectively.

On the other hand, pure blue emission was seen through the blue filter layer. Its luminance was 50 cd/m$^2$, and its CIE chromaticity was x=0.14 and y=0.16.

Yellowish green emission was seen through the fluorescent layer A. Its luminance was 113 cd/m$^2$, and its CIE chromaticity was x=0.23 and y=0.65.

Red emission with higher purity than in Example 1 was seen through the fluorescent layer B. Its luminance was 20 cd/m$^2$, and its CIE chromaticity was x=0.60 and y=0.31.

As in the above, the organic EL image display device produced herein gave the intended pure emission through each color-changing layer with no color mixing.

EXAMPLE 3

This is to demonstrate the embodiment of separating thin color-changing layers from the light-transmissive substrate at their bottom via a light-transmissive medium disposed therebetween.

A light-shielding layer pattern was formed on a light-transmissive substrate in the same manner as in Example 1. The thickness of the light-shielding layer pattern formed herein was 20 μm.

Next, a light-transmissive medium of a photo-curable acrylate resist, V259PA (manufactured by Shin-Nittetsu Chemical Co.) was applied onto the substrate by spin-coating, and baked at 80° C. Then, the substrate was set in an exposing device equipped with a high-pressure mercury lamp as the light source. Having been thus set in the exposing device, this was exposed at 300 mJ/cm$^2$ (365 nm) via a mask capable of forming a stripe pattern of 250 μm line and 650 μm gap as arranged in parallel alignment with the light-shielding layer pattern. Then, the mask was moved by 300 μm in the direction perpendicular to the light-shielding pattern, and the substrate was further exposed under the same condition.

Next, this was developed with an aqueous solution of 1 wt. % sodium carbonate for 2 minutes at room temperature, whereby two of three gaps of the light-shielding stripe pattern were partly filled with the resist.

Next, this was baked at 200° C. to thereby form a light-transmissive medium pattern of the resist. The thickness of the thus-formed, light-transmissive medium pattern was 5 μm.

Next, the substrate was processed in the same manner as in Example 1 to form a color-changing array thereon, as in FIG. 9, except that the blue filter layer pattern and the fluorescent layer A pattern were printed only on the light-transmissive medium pattern and that the color-changing array formed was not polished.

The surface roughness of the thus-formed, color-changing array was measured with a surface roughness meter (DEKTAK 3030). It was found that the color-changing array was planarized to have a surface roughness of 1.3 μm although the thickness of the blue filter layer pattern and that of the fluorescent layer A pattern were about 15 μm and the thickness of the fluorescent layer B pattern was about 20 μm.

Next, in the same manner as in Example 1, a silicon oxide layer and an organic EL element were formed over the color-changing array in that order. Thus was produced an organic EL image display device.

A direct current voltage of 8 V was applied to the device between the anode and the cathode, whereupon the device emitted light at the intersections of the thus-charged cathode and anode. The luminance and the CIE chromaticity (as designated in JIS Z 8701) of blue light originally emitted by the organic EL element, which was seen at the part at which the light-shielding layer and the color-changing layers had been cut off, were found to be 100 cd/m$^2$, and x=0.16 and y=0.24, respectively.

On the other hand, pure blue emission was seen through the blue filter layer. Its luminance was 50 cd/m$^2$, and its CIE chromaticity was x=0.14 and y=0.16.

Yellowish green emission was seen through the fluorescent layer A. Its luminance was 113 cd/m$^2$, and its CIE chromaticity was x=0.23 and y=0.65.

Red emission with higher purity than in Example 1 was seen through the fluorescent layer B. Its luminance was 20 cd/m$^2$, and its CIE chromaticity was x=0.60 and y=0.31.

As in the above, the organic EL image display device produced herein gave the intended pure emission through each color-changing layer with no color mixing.

EXAMPLE 4

This is to demonstrate the embodiment of partly embedding thick color-changing layers in a light-transmissive medium at their bottom.

A light-transmissive medium of a photo-curable acrylate resist, V259PA (manufactured by Shin-Nittetsu Chemical Co.) was applied by spin-coating onto the same light-transmissive substrate as that used in Example 1, and baked at 80° C. Then, the substrate was set in an exposing device equipped with a high-pressure mercury lamp as the light source. Having been thus set in the exposing device, this was exposed at 300 mJ/cm$^2$ (365 nm) via a mask capable of forming a stripe pattern of 650 μm line and 250 μm gap. The mask was so arranged that it might be in parallel alignment with the light-shielding layer pattern to be formed later.

Next, the substrate was developed with an aqueous solution of 1 wt. % sodium carbonate for 2 minutes at room temperature, and then baked at 200° C. to form a light-transmissive medium pattern thereon. The thickness of the thus-formed, light-transmissive medium pattern was 5 μm.

Next, a photo-curable acrylate resist containing 3% by weight, in terms of its solid content, of carbon black as dispersed therein and having a viscosity of 250 cps was applied onto the substrate by spin-coating under the same condition as in Example 2, and then baked at 80° C. This was set in an exposing device equipped with a high-pressure mercury lamp as the light source. Next, this was exposed at 900 mJ/cm$^2$ (365 nm) via a mask to give a stripe pattern of 50 μm line and 250 μm gap as arranged in parallel alignment with the light-transmissive medium pattern.

After the exposure, this was developed with an aqueous solution of 1 wt. % sodium carbonate at room temperature for 2 minutes, and then post-exposed at 3000 mJ/cm$^2$ throughout its entire surface from the side of the glass substrate, and baked at 200° C. to form a pattern of light-shielding layers. The thickness of the patterned light-shielding layer was 15 μm.

The light-transmissive medium pattern previously formed herein had openings at one of three gaps of the light-shielding stripe pattern, and the light-transmissive substrate was exposed out at those openings.

After this, the substrate was processed in the same manner as in Example 1 to form a color-changing array thereon, as in FIG. 8(b), except that the fluorescent layer pattern B was partly embedded in the openings of the light-transmissive medium pattern and that the color-changing array formed was not polished.

The surface roughness of the thus-formed, color-changing array was measured with a surface roughness meter (DEKTAK 3030). It was found that the color-changing array was planarized to have a surface roughness of 1.5 μm although the thickness of the blue filter layer pattern and that of the fluorescent layer A pattern were about 15 μm and the thickness of the fluorescent layer B pattern was about 20 μm.

Next, in the same manner as in Example 1, a silicon oxide layer and an organic EL element were formed over the color-changing array in that order. The organic EL image display thus formed herein was tested for its color emission in the same manner as in Example 2, and produced the same results as those in Example 2.

EXAMPLE 5

This is to demonstrate the embodiment of forming color-changing layers containing a light-transmissive medium.

A light-shielding layer pattern was formed on a light-transmissive substrate in the same manner as in Example 1. The thickness of the light-shielding layer pattern formed herein was 20 μm.

Next, the substrate was set in a screen printer, in which ink (having a viscosity of 13,000 cps), which had been prepared by mixing and dispersing 2.8% by weight, in terms of its solid content, of copper phthalocyanine pigment (C.I. Pigment Blue 15:6), 0.2% by weight, in terms of its solid content, of dioxazine pigment (C.I. Pigment Violet 23), 70% by weight of a binder, polyvinyl chloride resin (having a weight-average molecular weight of 20,000) and 27% by weight of a light-transmissive medium, polyvinyl pyrrolidone (having a weight-average molecular weight of 40,000) in a solvent of cyclohexanone, was applied into predetermined gaps in the light-shielding layer pattern on the substrate, using a printing plate for giving a stripe pattern of 250 μm line and 650 μm gap, and baked at 80° C. to form a blue filter pattern. The thickness of the patterned blue filter was about 20 μm.

Next, the printing plate was moved by 300 μm in parallel to the substrate in the direction perpendicular to the stripe arrangement of the blue filter layer pattern. Ink (having a viscosity of 12,000 cps) that had been prepared by dissolving Coumarin 6, a binder, polyvinyl chloride resin (having a weight-average molecular weight of 20,000) and a light-transmissive medium, polyvinyl pyrrolidone (having a weight-average molecular weight of 40,000) in a solvent, cyclohexanone, the amount of Coumarin 6 being 0.03 mols relative to the sum of polyvinyl chloride resin and polyvinyl pyrrolidone of being 1 kg, and the ratio of polyvinyl chloride resin to polyvinyl pyrrolidone being 70/30 by weight, was applied into other predetermined gaps in the light-shielding layer pattern, using the thus-moved printing plate, and baked at 80° C. to form a pattern of fluorescent layer C. The thickness of the patterned fluorescent layer C was about 20 μm.

Next, the printing plate was further moved by 300 μm in parallel to the substrate in the direction perpendicular to the stripe arrangement of the patterned fluorescent layer C. Ink was prepared by dissolving Coumarin 6, a fluorescent pigment that had been prepared by kneading 4% by weight, relative to benzoguanamine resin, of Rhodamine 6G and 4% by weight, relative to benzoguanamine resin, of Rhodamine B with benzoguanamine resin, and a binder, polyvinyl chloride resin (having a weight-average molecular weight of 20,000) in a solvent, cyclohexanone, in which the amount of Coumarin 6 was 0.03 mols relative to the sum of the fluorescent pigment and the polyvinyl chloride resin binder of being 1 kg, and the ratio of the fluorescent pigment to the polyvinyl chloride resin binder was 30/70 by weight. The thus-prepared ink had a viscosity of 8000 cps. The ink was applied into the remaining gaps in the light-shielding layer pattern, using the thus-moved printing plate, and baked at 80° C. to form a pattern of fluorescent layer B. The thickness of the patterned fluorescent layer B was about 20 μm.

As a result of this process, a color-changing array was formed on the substrate, as in FIG. 10, in the same manner as in Example 1. In this, however, the color-changing array formed was not polished. The surface roughness of the thus-formed, color-changing array was measured with a surface roughness meter (DEKTAK 3030). It was found that the color-changing array was planarized to have a surface roughness of 1.8 μm since the blue filter layer pattern, the fluorescent layer C pattern and the fluorescent layer B pattern were all unified to have a thickness of about 20 μm.

Next, in the same manner as in Example 1, a silicon oxide layer and an organic EL element were formed over the color-changing array in that order. Thus was produced an organic EL image display device.

A direct current voltage of 8 V was applied to the device between the anode and the cathode, whereupon the device emitted light at the intersections of the thus-charged cathode and anode. The luminance and the CIE chromaticity (as designated in JIS Z 8701) of blue light originally emitted by the organic EL element, which was seen at the part at which the light-shielding layer and the color-changing layers had been cut off, were found to be 100 cd/m$^2$, and x=0.16 and y=0.24, respectively.

On the other hand, pure blue emission was seen through the blue filter layer. Its luminance was 45 cd/m$^2$, and its CIE chromaticity was x=0.14 and y=0.14.

Yellowish green emission was seen through the fluorescent layer C. Its luminance was 110 cd/m$^2$, and its CIE chromaticity was x=0.23 and y=0.67.

Red emission with higher purity than in Example 1 was seen through the fluorescent layer B. Its luminance was 20 cd/m$^2$, and its CIE chromaticity was x=0.60 and y=0.31.

As in the above, the organic EL image display device produced herein gave the intended pure emission through each color-changing layer with no color mixing.

EXAMPLE 6

A photo-curable acrylate resist containing 30% by weight, in terms of its solid content, of carbon black as dispersed therein and having a viscosity of 10 cps was applied onto a glass substrate (Corning 7059) having a size of 100 mm×100 mm×1.1 mm (thickness), by spin-coating, then baked at 80° C., and thereafter post-baked at 200° C. to form on the substrate a black solid film having a thickness of 2 μm.

Next, the surface of the substrate not coated with the black solid film was washed with IPA and then with UV rays. The thus-washed substrate was then mounted on a substrate holder in a vapor deposition device (manufactured by Nippon Vacuum Technology Co.), in which resistance heating boats of molybdenum were filled with sources for vapor deposition. Precisely, the sources in those boats were a hole-injecting material of MTDATA and NPD, a light-emitting material of DPVBi, a dopant of DPAVB, and an electron-injecting material of Alq. In addition, a second metal for the cathode, Ag was set around tungsten filaments, and an electron-injecting metal for the cathode, Mg was put in a different molybdenum boat in the device.

The vacuum chamber of the device was degassed to have a vacuum degree of 5×10$^{-7}$ Torr, in which all the intended layers were continuously deposited one after another in the predetermined order mentioned below. During this continuous vapor deposition, the vacuum degree was all the time kept as it was in the vacuum chamber. First formed was a cathode pattern via a mask for giving a stripe pattern of 600 μm line and 100 μm gap.

Precisely, Mg and Ag were co-deposited via the mask to form the cathode pattern. For this, Mg was deposited at a vapor deposition rate of from 1.3 to 1.4 nm/sec, while Ag was at a rate of 0.1 nm/sec, to form a cathode pattern having a thickness of 200 nm.

Next, Alq was deposited at a rate of from 0.1 to 0.3 nm/sec to form an electron-injecting layer having a thickness of 20 nm. Then, DPVBi and DPAVB were co-deposited at a rate of from 0.1 to 0.3 nm/sec and at a rate of 0.05 nm/sec, respectively, to form a light-emitting layer having a thickness of 40 nm. In this, the ratio by weight of the dopant to the host material was from 1.2 to 1.6. Next, NPD was deposited at a rate of from 0.1 to 0.3 nm/sec to form a film having a thickness of 20 nm, and then MTDATA was deposited at a rate of from 0.1 to 0.3 nm/sec to form a film having a thickness of 400 nm. Thus was finally formed a hole-injecting layer.

Next, the thus-coated substrate was transferred into a sputtering device, in which a transparent electrode (anode) of ITO was formed on the substrate at room temperature via a mask for giving a stripe pattern of 250 μm line and 50 μm gap. The ITO electrode thus formed had a thickness of 120 nm and a sheet resistance of 20 Ω/square. In that manner, prepared was an organic EL element. For this, the masks used for forming the cathode and the anode were so arranged that the two electrodes might cross at right angles and that the terminals might be led out of those electrodes.

Next, a photo-curable epoxy adhesive, 3113 (manufactured by Three Bond Co.) was line-wise applied around the intersections of the cathode and the anode on the substrate, using a dispenser, to form a line pattern of the adhesive having a line width of about 1 mm.

On the other hand, in the same manner as in Example 1, a color-changing array composed of light-shielding layers and color-changing layers was formed on a substrate to have a surface roughness of 0.2 μm. The substrate was attached to the organic EL element prepared above with the color-changing array on the substrate facing the organic EL element via the adhesive pattern. Then, the adhesive was cured through UV exposure Next, a light-transmissive medium, fluorohydrocarbon, FC70 (manufactured by 3 M of US) was injected into the space between the color-changing array and the organic EL element through the gaps of the cured adhesive, using a syringe, in an nitrogen atmosphere.

Further, the same adhesive was introduced into the space through the gaps, and then cured in the same manner as above.

In that manner, produced herein was an organic EL image display device as in FIG. 3. A direct current voltage of 8 V was applied to the device between the anode and the cathode, whereupon the device emitted light at the intersections of the thus-charged cathode and anode. The luminance and the CIE chromaticity (as designated in JIS Z 8701) of blue light originally emitted by the organic EL element, which was seen at the part at which the light-shielding layer and the color-changing layers had been cut off, were found to be 100 cd/m$^2$, and x=0.16 and y=0.24, respectively.

On the other hand, blue emission was seen through the blue filter layer. Its luminance was 50 cd/m$^2$, and its CIE chromaticity was x=0.14 and y=0.16.

Yellowish green emission was seen through the fluorescent layer A. Its luminance was 113 cd/m$^2$, and its CIE chromaticity was x=0.23 and y=0.65.

Red emission was seen through the fluorescent layer B. Its luminance was 22 cd/m$^2$, and its CIE chromaticity was x=0.55 and y=0.29.

As in the above, the organic EL image display device produced herein gave the intended pure emission through each color-changing layer with no color mixing.

EXAMPLE 7

This is to demonstrate the embodiment of polishing the surface of the color-changing array of the same color-changing layers to planarize it.

As the light-transmissive substrate, used was a glass substrate (Corning 7059) having a size of 100 mm×100 mm×1.1 mm (thickness). A photo-curable acrylate resist containing 3% by weight, in terms of its solid content, of carbon black as dispersed therein and having a viscosity of 250 cps was applied onto the glass substrate by spin-coating and then baked at 80° C. This was set in an exposing device equipped with a high-pressure mercury lamp as the light source. Next, this was exposed at 900 mJ/cm² (365 nm) via a mask to give a stripe pattern of 50 μm line and 250 μm gap. After the exposure, this was developed with an aqueous solution of 1 wt. % sodium carbonate at room temperature for 2 minutes. Next, this was post-exposed at 3000 mJ/cm² throughout its entire surface from the side of the glass substrate, and baked at 200° C. to form a pattern of light-shielding layers on the substrate. The thickness of the patterned light-shielding layer was 20 μm.

Next, the substrate was set in a screen printer, in which ink (having a viscosity of 8000 cps), which had been prepared by dissolving Coumarin 6 and a binder, polyvinyl chloride resin (having a weight-average molecular weight of 20,000) in a solvent, cyclohexanone, the amount of Coumarin 6 being 0.03 mols relative to 1 kg of the binder resin, was applied into other predetermined gaps in the light-shielding layer pattern, using a printing plate for giving a stripe pattern of 250 μm×50 μm(gap), and baked at 80° C. to form a pattern of fluorescent layer A. The thickness of the patterned fluorescent layer A was about 15 μm.

Next, the surface of the color-changing array thus formed on the substrate was lapped with No. 800 sandpaper, while spraying pure water thereonto, and was further polished with a fine alumina abrasive, using a rotary grinder (manufactured by Speed Fam Co.), while still spraying pure water thereonto.

As a result of this process, the color-changing array was polished and planarized, as in FIG. 7(b), and its surface roughness was measured with a surface roughness meter (DEKTAK 3030) to be 0.2 μm.

Next, in the same manner as in Example 1, a silicon oxide layer and an organic EL element were formed over the color-changing array in that order. Thus was produced an organic EL monochromatic image display device.

A direct current voltage of 8 V was applied to the device between the anode and the cathode, whereupon the device emitted light at the intersections of the thus-charged cathode and anode. The luminance and the CIE chromaticity (as designated in JIS Z 8701) of blue light originally emitted by the organic EL element, which was seen at the part at which the light-shielding layer and the color-changing layers had been cut off, were found to be 100 cd/m², and x=0.16 and y=0.24, respectively.

On the other hand, yellowish green emission was seen through the fluorescent layer A. Its luminance was 113 cd/m², and its CIE chromaticity was x=0.23 and y=0.65.

Red emission with higher purity than in Example 1 was seen through the fluorescent layer B. Its luminance was 20 cd/m², and its CIE chromaticity was x=0.60 and y=0.31.

As in the above, the organic EL image display device produced herein gave the intended pure emission through color-changing layer with no color spread.

COMPARATIVE EXAMPLE 1

Herein produced is a reference device where some color-changing layers are thinner than light-shielding layers.

A color-changing array was prepared in the same manner as in Example 1, except that it was not polished. The surface roughness of the thus-formed, color-changing array was measured, using a surface roughness meter (DEKTAK 3030), to be 5.6 μm. In this array, the thickness of the blue filter layer pattern and that of the fluorescent layer A pattern were about 15 μm, and the thickness of the fluorescent layer B pattern was about 20 μm.

Using this color-changing array, an image display device was produced in the same manner as in Example 6. The device thus produced herein was as in FIG. 4(b) and FIG. 12.

A direct current voltage of 8 V was applied to the device between the anode and the cathode, whereupon the device emitted light at the intersections of the thus-charged cathode and anode. The luminance and the CIE chromaticity (as designated in JIS Z 8701) of blue light originally emitted by the organic EL element, which was seen at the part at which the light-shielding layer and the color-changing layers had been cut off, were found to be 100 cd/m², and x=0.16 and y=0.24, respectively.

On the other hand, pure blue emission was seen through the blue filter layer. Its luminance was 45 cd/m², and its CIE chromaticity was x=0.14 and y=0.16.

Yellowish green emission was seen through the fluorescent layer A. Its luminance was 103 cd/m², and its CIE chromaticity was x=0.23 and y=0.65.

Red emission was seen through the fluorescent layer B. Its luminance was 20 cd/m², and its CIE chromaticity was x=0.60 and y=0.31.

As in the above, the luminance of light seen though the blue filter layer and that through the fluorescent layer A were somewhat lower than those in Example 6. This is because, since the thickness of the adjacent light-shielding layers is thicker by about 5 μm than that of the blue filter layer and that of the fluorescent layer A, emitted light from the overlying organic EL element was partly absorbed by the adjacent light-shielding layers so that those thin color-changing layers could not satisfactorily receive the emitted light.

COMPARATIVE EXAMPLE 2

Herein produced is a reference device where some color-changing layers are thicker than light-shielding layers.

A color-changing array was prepared in the same manner as in Example 2, except that no grooves were formed on the light-transmissive substrate and that the fluorescent layer B pattern was not embedded in the substrate.

The surface roughness of the thus-formed, color-changing array was measured, using a surface roughness meter (DEKTAK 3030), to be 5.4 μm. In this array, the thickness of the blue filter layer pattern and that of the fluorescent layer A pattern were about 15 μm, and the thickness of the fluorescent layer B pattern was about 20 μm.

Using this color-changing array, an image display device was produced in the same manner as in Example 6. The device thus produced herein was as in FIG. 4(a) and FIG. 13.

A direct current voltage of 8 V was applied to the device between the anode and the cathode, whereupon the device emitted light at the intersections of the thus-charged cathode and anode. The luminance and the CIE chromaticity (as designated in JIS Z 8701) of blue light originally emitted by the organic EL element, which was seen at the part at which the light-shielding layer and the color-changing layers had been cut off, were found to be 100 cd/m², and x=0.16 and y=0.24, respectively.

On the other hand, blue emission was seen through the blue filter layer. Its luminance was 50 cd/m², and its CIE chromaticity was x=0.14 and y=0.16.

Yellowish green emission was seen through the fluorescent layer A. Its luminance was 110 cd/m², and its CIE chromaticity was x=0.30 and y=0.59.

Red emission was seen through the fluorescent layer B. Its luminance was 20 cd/m², and its CIE chromaticity was x=0.60 and y=0.31.

As in the above, the fluorescent layer A of this device gave mixed color with lower purity, as compared with that of the device in Example 2. This is because, since the thickness of the fluorescent layer B pattern is thicker by about 5 μm than that of the other layer patterns, light leaked out of the fluorescent layer B pattern penetrated into the fluorescent layer A pattern to cause the color mixing.

COMPARATIVE EXAMPLE 3

Herein produced is a reference device having no light-shielding layers.

A color-changing array was prepared in the same manner as in Example 1, except that no light-shielding layers were formed in the array.

A silicon oxide film and an organic EL element were formed on this array, in the same manner as in Example 1, to produce an organic EL image display device.

A direct current voltage of 8 V was applied to the device between the anode and the cathode, whereupon the device emitted light at the intersections of the thus-charged cathode and anode. The luminance and the CIE chromaticity (as designated in JIS Z 8701) of blue light originally emitted by the organic EL element, which was seen at the part at which and the color-changing layers had been cut off, were found to be 100 cd/m$^2$, and x=0.16 and y=0.24, respectively.

On the other hand, bluish green emission was seen through the blue filter layer. Its luminance was 55 cd/m$^2$, and its CIE chromaticity was x=0.20 and y=0.30.

Yellowish green emission was seen through the fluorescent layer A. Its luminance was 95 cd/m$^2$, and its CIE chromaticity was x=0.30 and y=0.51.

Pink emission was seen through the fluorescent layer B. Its luminance was 20 cd/m$^2$, and its CIE chromaticity was x=0.50 and y=0.31.

As in the above, since the device produced herein had no light-shielding layers, emitted light from each color-changing layer penetrated into the adjacent color-changing layers to cause color mixing. Therefore, this device gives images with poor color purity.

COMPARATIVE EXAMPLE 4

Herein produced is a reference device where the same color-changing layers are thinner than light-shielding layers.

A color-changing array was prepared in the same manner as in Example 7, except that it was not polished. The surface roughness of the thus-formed, color-changing array was measured, using a surface roughness meter (DEKTAK 3030), to be 5.1 μm. In this array, the thickness of the fluorescent layer A pattern were about 15 μm.

Using this color-changing array, a monochromatic image display device was produced in the same manner as in Example 6. The device thus produced herein was as in FIG. 4(b) and FIG. 12.

A direct current voltage of 8 V was applied to the device between the anode and the cathode, whereupon the device emitted light at the intersections of the thus-charged cathode and anode. The luminance and the CIE chromaticity (as designated in JIS Z 8701) of blue light originally emitted by the organic EL element, which was seen at the part at which the light-shielding layer and the color-changing layers had been cut off, were found to be 100 cd/m$^2$, and x=0.16 and y=0.24, respectively.

On the other hand, yellowish green emission was seen through the fluorescent layer A. Its luminance was 103 cd/m$^2$, and its CIE chromaticity was x=0.23 and y=0.65.

As in the above, the luminance of light seen though the fluorescent layer A were somewhat lower than those in Example 6. This is because, since the thickness of the adjacent light-shielding layers is thicker by about 5 μm than that of the fluorescent layer A, emitted light from the overlying organic EL element was partly absorbed by the adjacent light-shielding layers so that those thin color-changing layers could not satisfactorily receive the emitted light.

EXAMPLE 8

Herein demonstrated is the relationship between the surface roughness of substrate and the emission defects in organic EL element.

Four sheets of light-transmissive glass (Corning 7059) having a size of 100 mm×100 mm×1.1 mm (thickness) were prepared. Each sheet was coated with a photo-curable acrylate resist, CK2000 (manufactured by Fuji-Hunt Electronics Technology Co.) containing 30% by weight, in terms of its solid content, of carbon black as dispersed therein, by spin-coating at a varying number of revolutions, then baked at 80° C., and set in an exposing device equipped with a high-pressure mercury lamp as the light source. Next, this was exposed at 300 mJ/cm$^2$ (365 nm) via a mask for giving a stripe pattern of 50 μm line and 250 μm gap.

Next, this was developed with an aqueous solution of 1 wt. % sodium carbonate at room temperature for 2 minutes, and then baked at 200° C. to form a light-shielding layer pattern on the substrate. The thickness of the patterned light-shielding layer was 0.2 μm, 0.5 μm, 1.0 μm or 2.0 μm. which corresponds to the surface roughness of each substrate.

Next, a light-transmissive medium, silicon oxide (SiO$_2$) was sputtered onto each substrate, which had been heated at 160° C., in a vacuum of 10$^{-5}$ Torr. The thickness of the thus-formed silicon oxide layer was 0.5 μm.

After having been thus coated with the silicon oxide layer, the surface roughness of each substrate was measured to be the same as that of the non-coated one.

Next, an organic EL element was formed on each substrate in the same manner as in Example 1.

A direct current voltage of 8 V was applied to each EL device between the anode and the cathode, whereupon the device emitted light at the intersections of the thus-charged cathode and anode. From the light emission, the organic EL element formed on each substrate having a different surface roughness was evaluated. The results obtained are shown in Table 2 below.

As the control, prepared was a light-transmissive glass substrate having a surface roughness of smaller than 0.1 μm, on which was directly formed the organic EL element.

From the results in Table 2, it is known that the organic EL elements as formed on the substrates having a surface roughness of not larger than 2.0 μm were neither broken nor short-circuited to lower the luminance or to cause cross-talk.

COMPARATIVE EXAMPLE 5

Organic EL devices were produced in the same manner as in Example 8, except that the thickness of the light-shielding layer pattern was varied to 3.0 μm. 4.0 μm or 5.0 μm.

These devices were tested in the same manner as in Example 8, and the results obtained are shown in Table 2.

From the results in Table 2, it is known that the organic EL elements as formed on the substrates having a surface roughness of 3.0 μm or larger were broken or short-circuited to lower the luminance with causing cross-talk.

TABLE 2

|  | Surface Roughness of Substrate (μm) | Luminance Decrease[1] | Cross-talk[1] |
|---|---|---|---|
| Example 8 | 0.2 | undetectable | undetectable |
|  | 0.5 | undetectable | undetectable |
|  | 1.0 | undetectable | detectable, a little |
|  | 2.0 | detectable, a little | detectable, a little |
| Comparative Example 5 | 3.0 | detectable | detectable |
|  | 4.0 | detectable | detectable |
|  | 5.0 | detectable | detectable |

[1]Based on the organic EL element formed on the control, smooth light-transmissive substrate (having a surface roughness of smaller than 0.1 μm).

As has been mentioned in detail hereinabove, the present invention provides a practicable, image display device which is advantageous in that the images formed have a high luminance and good visibility with no color mixing and color spread, and that its producibility is high.

While the invention has been described in detail and with reference to specific embodiments thereof, it will be apparent to one skilled in the art that various changes and modifications can be made therein without departing from the spirit and scope thereof.

What is claimed is:

1. An image display device comprising a color-changing array of a plurality of light-shielding layers and a plurality of color-changing layers, of which at least one is a fluorescent layer, as disposed in series on a light-transmissive substrate with being laterally spaced, and an array of a plurality of light-emitting layers as laterally spaced to be in the position corresponding to each color-changing layer in such a manner that the color-changing layers receive emitted light from the light-emitting layers to change it into different colors, the device being characterized in that the surface of the color-changing array that faces the array of light-emitting layers is planarized to thereby reduce its surface roughness to 2.0 μm or lower.

2. The image display device as claimed in claim 1, in which the color-changing array and the light-emitting array are disposed via a light-transmissive medium therebetween.

3. The image display device as claimed in claim 1, in which the light-emitting array is of an organic electroluminescent (EL) element.

4. The image display device as claimed in claim 1, in which the image display device is a multicolor image display.

5. The image display device as claimed in claim 1, in which the thickness of each color-changing layer is 10 μm or more.

6. The image display device as claimed in claim 1, in which the surface of the color-changing array that faces the light-emitting array is polished.

7. The image display device as claimed in claim 1, in which at least one of the color-changing layers is partly embedded in the light-transmissive substrate or in the light-transmissive medium at its bottom.

8. The image display device as claimed in claim 1, in which at least one of the color-changing layers is separated from the light-transmissive substrate at its bottom via a light-transmissive medium therebetween.

9. The image display device as claimed in claim 1, in which at least one of the color-changing layers contains a light-transmissive medium.

10. The image display device as claimed in claim 7, in which at least one of the color-changing layers is a red-emitting fluorescent layer.

11. The image display device as claimed in claim 2, in which the light-emitting array is of an organic electroluminescent (EL) element.

12. The image display device as claimed in claim 2, in which the image display device is a multicolor image display.

13. The image display device as claimed in claim 3, in which the image display device is a multicolor image display.

14. The image display device as claimed in claim 1, in which the image display device is a multicolor image display.

15. The image display device as claimed in claim 2, in which the thickniess of each color-changing layer is 10 μm or more.

16. The image display device as claimed in claim 3, in which the thickness of each color-changing layer is 10 μm or more.

17. The image display device as claimed in claim 4, in which the thickness of each color-changing layer is 10 μm or more.

18. The image display device as claimed in claim 11, in which the thickness of each color-changing layer is 10 μm or more.

19. The image display device as claimed in claim 12, in which the thickness of each color-changing layer is 10 μm or more.

20. The image display device as claimed in claim 13, in which the thickness of each color-changing layer is 10 μm or more.

21. The image display device as claimed in claim 14, in which the thickness of each color-changing layer is 10 μm or more.

22. The image display device as claimed in claim 2, in which the surface of the color-changing array that faces the light-emitting array is polished.

23. The image display device as claimed in claim 3, in which the surface of the color-changing array that faces the light-emitting array is polished.

24. The image display device as claimed in claim 4, in which the surface of the color-changing array that faces the light-emitting array is polished.

25. The image display device as claimed in claim 11, in which the surface of the color-changing array that faces the light-emitting array is polished.

26. The image display device as claimed in claim 12, in which the surface of the color-changing array that faces the light-emitting array is polished.

27. The image display device as claimed in claim 13, in which the surface of the color-changing array that faces the light-emitting array is polished.

28. The image display device as claimed in claim 14, in which the surface of the color-changing array that faces the light-emitting array is polished.

29. The image display device as claimed in claim 2, in which at least one of the color-changing layers is partly embedded in the light-transmissive substrate or in the light-transmissive medium at its bottom.

30. The image display device as claimed in claim 3, in which at least one of the color-changing layers is partly embedded in the light-transmissive substrate or in the light-transmissive medium at its bottom.

31. The image display device as claimed in claim 4, in which at least one of the color-changing layers is partly embedded in the light-transmissive substrate or in the light-transmissive medium at its bottom.

32. The image display device as claimed in claim 1, in which at least one of the color-changing layers is partly embedded in the light-transmissive substrate or in the light-transmissive medium at its bottom.

33. The image display device as claimed in claim 12, in which at least one of the color-changing layers is partly embedded in the light-transmissive substrate or in the light-transmissive medium at its bottom.

34. The image display device as claimed in claim 13, in which at least one of the color-changing layers is partly embedded in the light-transmissive substrate or in the light-transmissive medium at its bottom.

35. The image display device as claimed in claim 14, in which at least one of the color-changing layers is partly embedded in the light-transmissive substrate or in the light-transmissive medium at its bottom.

36. The image display device as claimed in claim 2, in which at least one of the color-changing layers is separated from the light-transmissive substrate at its bottom via a light-transmissive medium therebetween.

37. The image display device as claimed in claim 3, in which at least one of the color-changing layers is separated from the light-transmissive substrate at its bottom via a light-transmissive medium therebetween.

38. The image display device as claimed in claim 4, in which at least one of the color-changing layers is separated from the light-transmissive substrate at its bottom via a light-transmissive medium therebetween.

39. The image display device as claimed in claim 11, in which at least one of the color-changing layers is separated from the light-transmissive substrate at its bottom via a light-transmissive medium therebetween.

40. The image display device as claimed in claim 12, in which at least one of the color-changing layers is separated from the light-transmissive substrate at its bottom via a light-transmissive medium therebetween.

41. The image display device as claimed in claim 13, in which at least one of the color-changing layers is separated from the light-transmissive substrate at its bottom via a light-transmissive medium therebetween.

42. The image display device as claimed in claim 14, in which at least one of the color-changing layers is separated from the light-transmissive substrate at its bottom via a light-transmissive medium therebetween.

43. The image display device as claimed in claim 2, in which at least one of the color-changing layers contains a light-transmissive medium.

44. The image display device as claimed in claim 3, in which at least one of the color-changing layers contains a light-transmissive medium.

45. The image display device as claimed in claim 4, in which at least one of the color-changing layers contains a light-transmissive medium.

46. The image display device as claimed in claim 11, in which at least one of the color-changing layers contains a light-transmissive medium.

47. The image display device as claimed in claim 12, in which at least one of the color-changing layers contains a light-transmissive medium.

48. The image display device as claimed in claim 13, in which at least one of the color-changing layers contains a light-transmissive medium.

49. The image display device as claimed in claim 14, in which at least one of the color-changing layers contains a light-transmissive medium.

50. The image display device as claimed in claim 29, in which at least one of the color-changing layers is a red-emitting fluorescent layer.

51. The image display device as claimed in claim 30, in which at least one of the color-changing layers is a red-emitting fluorescent layer.

52. The image display device as claimed in claim 31 in which at least one of the color-changing layers is a red-emitting fluorescent layer.

53. The image display device as claimed in claim 32, in which at least one of the color-changing layers is a red-emitting fluorescent layer.

54. The image display device as claimed in claim 33, in which at least one of the color-changing layers is a red-emitting fluorescent layer.

55. The image display device as claimed in claim 34, in which at least one of the color-changing layers is a red-emitting fluorescent layer.

56. The image display device as claimed in claim 35, in which at least one of the color-changing layers is a red-emitting fluorescent layer.

* * * * *